(12) United States Patent
Yoo et al.

(10) Patent No.: US 12,008,184 B2
(45) Date of Patent: Jun. 11, 2024

(54) DISPLAY DEVICE AND INPUT SYSTEM INCLUDING THE SAME

(71) Applicant: SAMSUNG DISPLAY CO., LTD., Yongin-si (KR)

(72) Inventors: Gi Na Yoo, Yongin-si (KR); Ju Yeon Kim, Yongin-si (KR); Won Sang Park, Yongin-si (KR); Chang Woo Shim, Yongin-si (KR); Seong Jun Lee, Yongin-si (KR); Sang Hyun Jun, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/178,293

(22) Filed: Mar. 3, 2023

(65) Prior Publication Data

US 2023/0409135 A1 Dec. 21, 2023

(30) Foreign Application Priority Data

Jun. 17, 2022 (KR) .................. 10-2022-0074344

(51) Int. Cl.
*G06F 3/041* (2006.01)
*G06F 3/044* (2006.01)
*H10K 59/38* (2023.01)

(52) U.S. Cl.
CPC .......... *G06F 3/0412* (2013.01); *G06F 3/0446* (2019.05); *H10K 59/38* (2023.02); *G06F 2203/04112* (2013.01)

(58) Field of Classification Search
CPC ................ G06F 3/0412; G06F 3/0446; G06F 2203/04112; G06F 2203/04111; G06F 3/0443; H10K 59/38; H10K 59/40; H10K 59/8792
See application file for complete search history.

(56) References Cited

U.S. PATENT DOCUMENTS

| | | | |
|---|---|---|---|
| 10,417,477 B2 * | 9/2019 | Ko | ............................ G02B 6/08 |
| 2005/0145703 A1 * | 7/2005 | Bryborn | ........... G06K 19/06037 235/494 |

(Continued)

FOREIGN PATENT DOCUMENTS

| | | |
|---|---|---|
| CN | 110165085 | 9/2020 |
| KR | 10-2195966 | 12/2020 |

(Continued)

*Primary Examiner* — Ibrahim A Khan
(74) *Attorney, Agent, or Firm* — F. Chau & Associates, LLC

(57) ABSTRACT

A display device includes a plurality of emission areas that emit light, a plurality of touch electrodes disposed in a light blocking area surrounding the plurality of emission areas, in which the touch electrodes sense a touch, a first insulating layer disposed on the plurality of touch electrodes, and a plurality of light blocking parts disposed on the first insulating layer and overlapping the plurality of touch electrodes. A part of the plurality of light blocking parts includes a code pattern formed by an insertion portion inserted into the first insulating layer and overlapping the plurality of touch electrodes, and another part of the plurality of light blocking parts includes a non-code pattern formed by not having the insertion portion.

20 Claims, 16 Drawing Sheets

(56) References Cited

U.S. PATENT DOCUMENTS

| | | | | |
|---|---|---|---|---|
| 2008/0101702 | A1* | 5/2008 | Sonoda | G06F 3/03545 |
| | | | | 382/188 |
| 2012/0224229 | A1* | 9/2012 | Yoshida | H04N 1/32309 |
| | | | | 358/3.06 |
| 2014/0211103 | A1* | 7/2014 | Baek | G02F 1/133753 |
| | | | | 349/110 |
| 2014/0267955 | A1* | 9/2014 | Hibayashi | G02F 1/133514 |
| | | | | 349/12 |
| 2015/0362776 | A1* | 12/2015 | Jikumaru | H10K 59/40 |
| | | | | 349/12 |
| 2017/0278899 | A1* | 9/2017 | Yang | H10K 77/111 |
| 2018/0321788 | A1* | 11/2018 | Kimura | G02F 1/13306 |
| 2020/0285337 | A1* | 9/2020 | Lee | H10K 59/122 |
| 2020/0393936 | A1* | 12/2020 | Bok | H10K 59/131 |
| 2021/0120324 | A1* | 4/2021 | Seo | H10K 59/65 |
| 2022/0229514 | A1* | 7/2022 | Park | H10K 59/40 |
| 2022/0392962 | A1* | 12/2022 | Park | G06F 3/0446 |

FOREIGN PATENT DOCUMENTS

| | | |
|---|---|---|
| KR | 10-2022-0023284 | 3/2022 |
| KR | 10-2023-0016737 | 2/2023 |

\* cited by examiner

DU: SUB, TFTL, EML, TFEL

DISPLAY DEVICE AND INPUT SYSTEM INCLUDING THE SAME

CROSS-REFERENCE TO RELATED APPLICATION

This application claims priority under 35 U.S.C. § 119 to Korean Patent Application No. 10-2022-0074344, filed on Jun. 17, 2022 in the Korean Intellectual Property Office, the disclosure of which is incorporated by reference herein in its entirety.

TECHNICAL FIELD

Embodiments of the present disclosure relate to a display device and an input system including the same.

DISCUSSION OF RELATED ART

As information-oriented society evolves, increased demands are placed on display devices that display images. For example, display devices are utilized in various electronic devices such as smartphones, digital cameras, laptop computers, navigation devices, and smart televisions. The display device may be a flat panel display device such as a liquid crystal display device, a field emission display device or an organic light emitting display device. Among the flat panel display devices, in a light emitting display device, since each of pixels of a display panel includes a light emitting element capable of emitting light by itself, an image can be displayed without a backlight unit providing light to the display panel.

A recent display device supports touch input using a user's body part (e.g., a finger) and input using an input pen. The input using the input pen allows the display device to detect the input more sensitively than the input using only a part of a user's body.

SUMMARY

Aspects of the present disclosure provide a display device and an input system including the same, which can utilize accurate input coordinates to perform a corresponding function, reduce cost and power consumption, and simplify a driving process, by generating input coordinate data of an input device without complex calculation and correction in a case in which an input is performed at the display device using the input device.

According to an embodiment of the disclosure, a display device includes a plurality of emission areas that emit light, a plurality of touch electrodes disposed in a light blocking area surrounding the plurality of emission areas that sense a touch, a first insulating layer disposed on the plurality of touch electrodes, and a plurality of light blocking parts disposed on the first insulating layer and overlapping the plurality of touch electrodes. A part of the plurality of light blocking parts includes a code pattern formed by an insertion portion inserted into the first insulating layer and overlapping the plurality of touch electrodes, and another part of the plurality of light blocking parts includes a non-code pattern formed by not having the insertion portion.

In an embodiment, the code pattern and the non-code pattern have a difference in reflectance with respect to light of a specific wavelength.

In an embodiment, a thickness of the code pattern is greater by about 0.5 $\mu m$ than a thickness of the non-code pattern.

In an embodiment, a width of each of the touch electrodes is smaller than a width of each of the light blocking parts.

In an embodiment, the display device further includes a second insulating layer disposed between the plurality of touch electrodes and the first insulating layer. The insertion portion is inserted into the first insulating layer and is in contact with an upper surface of the second insulating layer.

In an embodiment, the display device further includes a bridge electrode disposed on the second insulating layer and electrically connected to a part of the touch electrodes among the plurality of touch electrodes.

In an embodiment, the display device further includes a bridge electrode disposed on a bottom of the plurality of touch electrodes and electrically connected to a part of the touch electrodes among the plurality of touch electrodes.

In an embodiment, the insertion portion is in contact with an upper surface of an overlapping touch electrode among the plurality of touch electrodes.

In an embodiment, the display device further includes a bridge electrode disposed on the first insulating layer and covered by a part of the plurality of light blocking parts and electrically connected to a part of the touch electrodes among the plurality of touch electrodes.

In an embodiment, the insertion portion is in contact with an upper surface of an overlapping touch electrode among the plurality of touch electrodes.

In an embodiment, the plurality of light blocking parts includes a first portion extending in a first direction and a second portion crossing the first portion. In a case in which the intersection point of the first portion and the second portion overlaps the code pattern, a width of the corresponding light blocking part is relatively increased compared to a case in which the intersection point does not overlap the code pattern.

In an embodiment, the code pattern is formed in a planar mesh structure and surrounds at least one of the plurality of emission areas.

According to an embodiment of the disclosure, a display device includes a plurality of emission areas that emit light, a first insulating layer, a plurality of touch electrodes disposed on the first insulating layer in a light blocking area surrounding the plurality of emission areas, where to the touch electrodes sense a touch, a plurality of first light blocking parts covering the plurality of touch electrodes, a plurality of color filters respectively disposed on the first insulating layer in areas corresponding to the plurality of emission areas, a second insulating layer disposed on the plurality of color filters, and a plurality of second light blocking parts disposed on the second insulating layer and overlapping the plurality of touch electrodes. A part of the plurality of second light blocking parts includes a code pattern formed by an insertion portion inserted into the second insulating layer and overlapping the plurality of touch electrodes, and another part of the plurality of second light blocking parts includes a non-code pattern formed by not having the insertion portion.

In an embodiment, the code pattern and the non-code pattern have a difference in reflectance with respect to light of a specific wavelength.

In an embodiment, a thickness of the code pattern may be greater by about 0.5 $\mu m$ than a thickness of the non-code pattern.

In an embodiment, the insertion portion is in contact with an upper surface of the plurality of the color filters.

In an embodiment, the plurality of emission areas include a first emission area, a second emission area having a smaller size than the first emission area, and a third emission area having a larger size than the first emission area. The plurality of color filters includes a first color filter disposed in the first emission area, a second color filter disposed in the second emission area, and a third color filter disposed in the third emission area. An edge of the second color filter may cover an edge of the third color filter or the first color filter.

In an embodiment, a width of the first light blocking part is greater than a width of the touch electrode, and a width of the second light blocking part is greater than the width of the first light blocking part.

In an embodiment, the display device further includes a bridge electrode disposed on a bottom of the plurality of touch electrodes and electrically connected to a part of the touch electrodes among the plurality of touch electrodes.

According to an embodiment of the disclosure, an input system includes a display device configured to display an image, and an input device configured to input a touch to the display device. The display device includes a plurality of emission areas that emit light, a plurality of touch electrodes disposed in a light blocking area surrounding the plurality of emission areas in which the touch electrodes sense a touch, a first insulating layer disposed on the plurality of touch electrodes, and a plurality of light blocking parts disposed on the first insulating layer and overlapping the plurality of touch electrodes. A part of the plurality of light blocking parts includes a code pattern formed by an insertion portion inserted into the first insulating layer and overlapping the plurality of touch electrodes, and another part of the plurality of light blocking parts includes a non-code pattern formed by not having the insertion portion. The input device photographs the code pattern, converts the code pattern into a preset data code, and transmits coordinate data composed of the data code to the display device.

In the display device and the input system including the same according to embodiments of the present disclosure, a code pattern and a non-code pattern may have a predetermined infrared reflectance difference. As a result, in a case in which the infrared camera captures the light blocking part, the code pattern can be distinguished from the non-code pattern and an input device such as, for example, an input pen, may capture the code pattern. At least one code pattern or a combination of code patterns may have position information according to a specific criterion, and may correspond to a preset code in a one-to-one correspondence. Accordingly, the display device and the input system including the same may generate coordinate data composed of data codes without complex calculation and correction, thereby performing a corresponding function using accurate input coordinates, reducing cost and power consumption, and simplifying a driving process according to embodiments. In addition, since the display device and the input system including the same include a code pattern included in the touch sensing unit, embodiments of the present disclosure are not limited in size and may be applied to all electronic devices having a touch function.

However, the effects of the present disclosure are not limited to the aforementioned effects, and various other effects may be achieved according to embodiments of the present disclosure.

BRIEF DESCRIPTION OF THE DRAWINGS

The above and other features of the present disclosure will become more apparent by describing in detail embodiments thereof with reference to the accompanying drawings, in which.

DETAILED DESCRIPTION OF THE EMBODIMENTS

Figure 1:
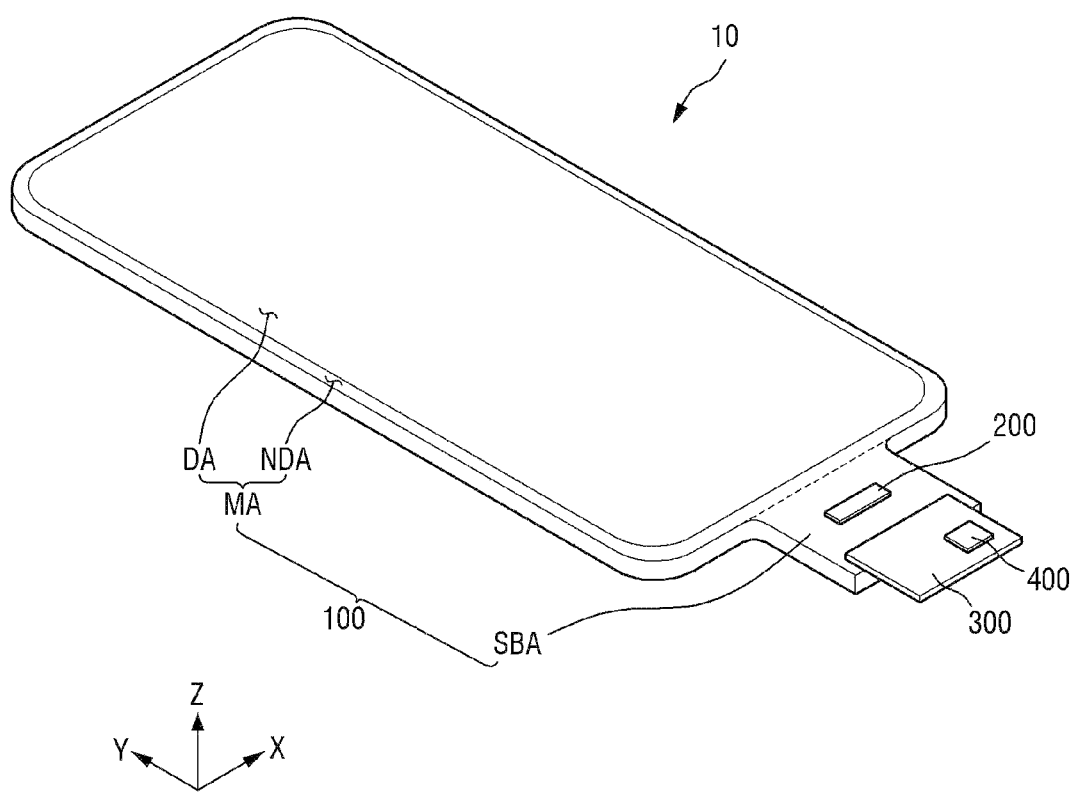
FIG. 1 is a perspective view showing a display device according to an embodiment.

Embodiments of the present disclosure will be described more fully hereinafter with reference to the accompanying drawings. Like reference numerals may refer to like elements throughout the accompanying drawings.

In the following description, for the purposes of explanation, numerous specific details are set forth to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but are not necessarily exclusive. For example, specific shapes, configurations, and characteristics of an embodiment may be used or implemented in other embodiments without departing from the spirt and scope of the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the spirit and scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

When an embodiment may be implemented differently, a specific process order may be performed differently from the described order. For example, two consecutively described processes may be performed substantially at the same time or performed in an order opposite to the described order.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Other words used to describe the relationships between elements should be interpreted in a like fashion.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for example, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

FIG. 1 is a perspective view showing a display device according to an embodiment.

Referring to FIG. 1, a display device 10 may be utilized in portable electronic devices such as, for example, a mobile phone, a smartphone, a tablet personal computer, a mobile communication terminal, an electronic organizer, an electronic book, a portable multimedia player (PMP), a navigation system, an ultra mobile PC (UMPC) or the like. For example, the display device 10 may be utilized as a display unit of a television, a laptop, a monitor, a billboard, or an Internet-of-Things (IoT) device. For another example, the display device 10 may be utilized in wearable devices such as, for example, a smartwatch, a watch phone, a glasses type display, or a head mounted display (HMD).

The display device 10 may have a planar shape similar to a quadrilateral shape. For example, the display device 10 may have a shape similar to a quadrilateral shape, in a plan view, having short sides in an X-axis direction and long sides in a Y-axis direction. The corner where the short side in the X-axis direction and the long side in the Y-axis direction meet may be rounded to have a predetermined curvature or may be right-angled. The planar shape of the display device 10 is not limited to a quadrilateral shape, and may be formed in a shape similar to, for example, another polygonal shape, a circular shape, or elliptical shape.

The display device 10 may include a display panel 100, a display driver 200, a circuit board 300, and a touch driver 400.

The display panel 100 may include a main region MA and a sub-region SBA.

The main region MA may include a display area DA including a plurality of pixels that display an image and a non-display area NDA disposed around the display area DA in which an image is not displayed. The display area DA may emit light from a plurality of emission areas or a plurality of opening areas. For example, the display panel 100 may include a pixel circuit including switching elements, a pixel defining layer that defines an emission area or an opening area, and a self-light emitting element.

For example, the self-light emitting element may include at least one of an organic light emitting diode (LED) including an organic light emitting layer, a quantum dot LED including a quantum dot light emitting layer, an inorganic LED including an inorganic semiconductor, or a micro LED, but is not limited thereto. The self-light emitting element may also be referred to herein as a light emitting element.

The non-display area NDA may be an area disposed outside of the display area DA. The non-display area NDA may be defined as an edge area of the main region MA of the display panel 100. The non-display area NDA may include a gate driver that supplies gate signals to the gate lines, and fan-out lines that connect the display driver 200 to the display area DA.

The sub-region SBA may extend from one side of the main region MA. The sub-region SBA may include a flexible material which can be bent, folded or rolled. For example, in a case in which the sub-region SBA is bent, the sub-region SBA may overlap the main region MA in a thickness direction (Z-axis direction). The sub-region SBA may include the display driver 200 and the pad unit connected to the circuit board 300. In an embodiment, the sub-region SBA may be omitted, and the display driver 200 and the pad unit may be arranged in the non-display area NDA.

The display driver 200 may output signals and voltages that drive the display panel 100. The display driver 200 may supply data voltages to data lines. The display driver 200 may supply a power voltage to the power line and may supply a gate control signal to the gate driver. The display driver 200 may be formed as an integrated circuit (IC) and mounted on the display panel 100 by, for example, a chip on glass (COG) method, a chip on plastic (COP) method, or an ultrasonic bonding method. For example, the display driver 200 may be disposed in the sub-region SBA, and may overlap the main region MA in the thickness direction (Z-axis direction) by bending of the sub-region SBA. For another example, the display driver 200 may be mounted on the circuit board 300.

The circuit board 300 may be attached to the pad unit of the display panel 100 by using an anisotropic conductive film (ACF). Lead lines of the circuit board 300 may be electrically connected to a pad unit of the display panel 100. The circuit board 300 may be, for example, a flexible printed circuit board, a printed circuit board, or a flexible film such as a chip on film.

A touch driver 400 may be mounted on the circuit board 300. The touch driver 400 may be connected to a touch sensing unit of the display panel 100. The touch driver 400 may supply a touch driving signal to a plurality of touch electrodes of the touch sensing unit and may sense an amount of change in capacitance between the plurality of touch electrodes. For example, the touch driving signal may be a pulse signal having a predetermined frequency. The touch driver 400 may calculate whether an input is made and input coordinates based on an amount of change in capacitance between the plurality of touch electrodes. The touch driver 400 may be an integrated circuit (IC).

Figure 2:
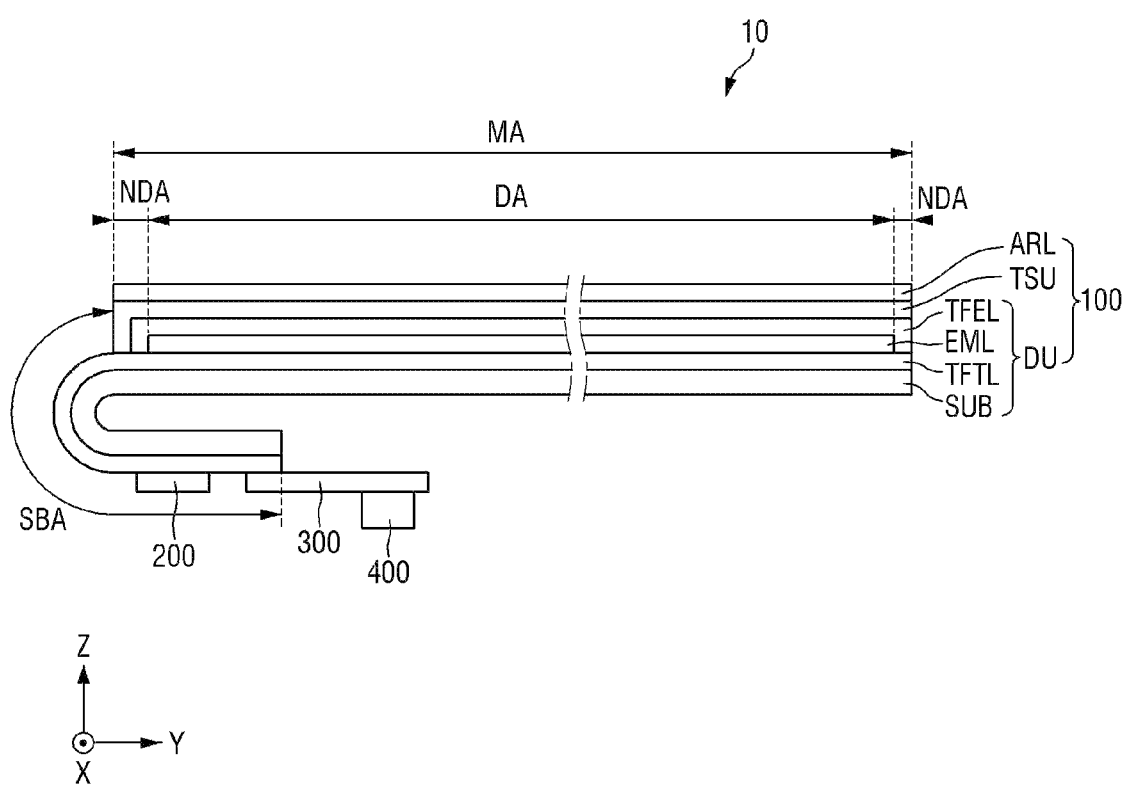
FIG. 2 is a cross-sectional view illustrating a display device according to an embodiment.

FIG. 2 is a cross-sectional view illustrating a display device according to an embodiment.

Referring to FIG. 2, the display panel 100 may include a display unit DU, a touch sensing unit TSU, and an antireflection layer ARL. The display unit DU may include a substrate SUB, a thin film transistor layer TFTL, a light emitting element layer EML, and an encapsulation layer TFEL. Thus, the term display unit DU as used herein may refer to the substrate SUB, the thin film transistor layer TFTL, the light emitting element layer EML (including light emitting elements disposed in the light emitting element layer EML), and the encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the SUB may include a glass material or a metal material.

The thin film transistor layer TFTL may be disposed on the substrate SUB. The thin film transistor layer TFTL may include a plurality of thin film transistors constituting a pixel circuit of pixels. The thin film transistor layer TFTL may further include, for example, gate lines, data lines, power lines, gate control lines, fan-out lines that connect the display driver 200 to the data lines, and lead lines that connect the display driver 200 to the pad unit. Each of the thin film transistors may include, for example, a semiconductor region, a source electrode, a drain electrode, and a gate electrode. For example, in a case in which the gate driver is formed on one side of the non-display area NDA of the display panel 100, the gate driver may include thin film transistors.

The thin film transistor layer TFTL may be disposed in the display area DA, the non-display area NDA, and the sub-region SBA. Thin film transistors, gate lines, data lines, and power lines of each of the pixels of the thin film transistor layer TFTL may be disposed in the display area DA. Gate control lines and fan-out lines of the thin film transistor layer TFTL may be disposed in the non-display area NDA. The lead lines of the thin film transistor layer TFTL may be disposed in the sub-region SBA.

The light emitting element layer EML may be disposed on the thin film transistor layer TFTL. The light emitting element layer EML may include a plurality of light emitting elements in which a first electrode, a light emitting layer, and a second electrode are sequentially stacked to emit light, and a pixel defining layer that defines pixels. A plurality of light emitting elements of the light emitting element layer EML may be disposed in the display area DA.

For example, the light emitting layer may be an organic light emitting layer including an organic material. The light emitting layer may include, for example, a hole transporting layer, an organic light emitting layer, and an electron transporting layer. In a case in which the first electrode receives a predetermined voltage through the thin film transistor of the thin film transistor layer TFTL and the second electrode receives the cathode voltage, holes and electrons may be transferred to the organic light emitting layer through the hole transporting layer and the electron transporting layer, respectively, and may be combined with each other to emit light in the organic light emitting layer. For example, the first electrode may be an anode electrode, and the second electrode may be a cathode electrode, but the present disclosure is not limited thereto.

For another example, the plurality of light emitting elements may include a quantum dot light emitting diode including a quantum dot light emitting layer, an inorganic light emitting diode including an inorganic semiconductor, or a micro light emitting diode.

The encapsulation layer TFEL may cover the top surface and the side surface of the light emitting element layer EML, and may protect the light emitting element layer EML. The encapsulation layer TFEL may include at least one inorganic layer and at least one organic layer that encapsulate the light emitting element layer EML.

The touch sensing unit TSU may be disposed on the encapsulation layer TFEL. The touch sensing unit TSU may include a plurality of touch electrodes that sense a user's touch in a capacitive manner, and touch lines connecting the plurality of touch electrodes to the touch driver 400. For example, the touch sensing unit TSU may sense the user's touch by using a mutual capacitance method or a self-capacitance method.

For another example, the touch sensing unit TSU may be disposed on a separate substrate disposed on the display unit DU. In this case, the substrate supporting the touch sensing unit TSU may be a base member that encapsulates the display unit DU.

The plurality of touch electrodes of the touch sensing unit TSU may be disposed in a touch sensor area that overlaps the display area DA. The touch lines of the touch sensing unit TSU may be disposed in a touch peripheral area that overlaps the non-display area NDA.

The antireflection layer ARL may be disposed on the touch sensing unit TSU. The antireflection layer ARF may reduce a decrease in visibility due to reflection of external light by preventing or reducing reflection of the external light. The antireflection layer ARL may protect the top surface of the display device 10. The antireflection layer ARL may be omitted in embodiments. For example, the antireflection layer ARL may include a polarizing film.

The sub-region SBA of the display panel 100 may extend from one side of the main region MA. The sub-region SBA may include a flexible material which can be bent, folded or rolled. For example, in a case in which the sub-region SBA is bent, the sub-region SBA may overlap the main region MA in a thickness direction (Z-axis direction). The sub-region SBA may include the display driver 200 and the pad unit electrically connected to the circuit board 300.

Figure 3:
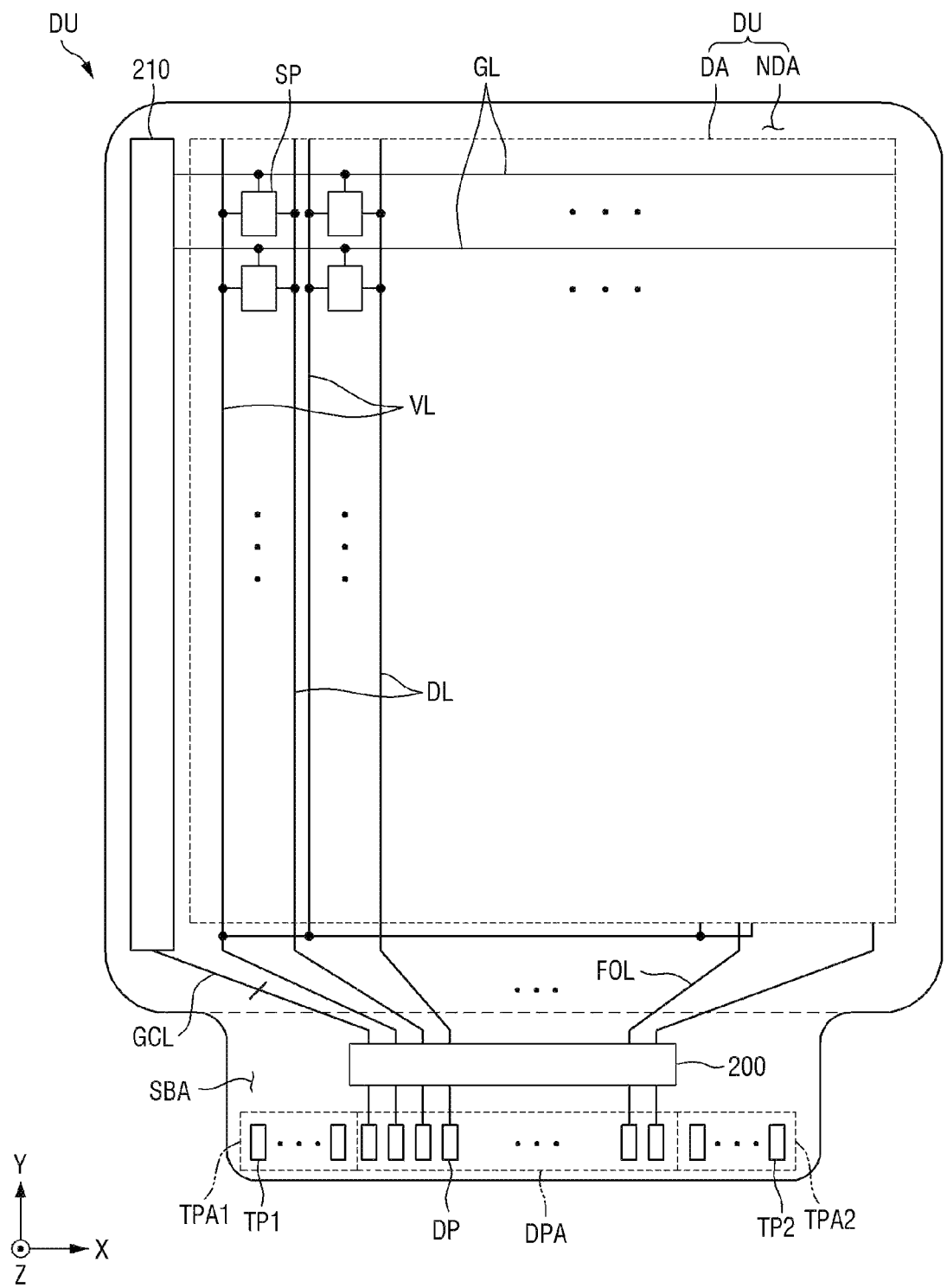
FIG. 3 is a plan view illustrating a display unit of a display device according to an embodiment.

FIG. 3 is a plan view illustrating a display unit of a display device according to an embodiment.

Referring to FIG. 3, the display unit DU may include the display area DA and the non-display area NDA. For example, the display unit DU as described above may be disposed in the display area DA and the non-display area NDA.

The display area DA, which is an area in which an image is displayed, may be defined as the central area of the display panel 100. The display area DA may include a plurality of pixels SP, a plurality of gate lines GL, a plurality of data lines DL, and a plurality of power lines VL. Each of the plurality of pixels SP may be defined as the smallest unit that outputs light.

The plurality of gate lines GL may supply the gate signals received from the gate driver 210 to the plurality of pixels SP. The plurality of gate lines GL may extend in the X-axis direction and may be spaced apart from each other in the Y-axis direction that crosses the X-axis direction.

The plurality of data lines DL may supply the data voltages received from the display driver 200 to the plurality of pixels SP. The plurality of data lines DL may extend in the Y-axis direction and may be spaced apart from each other in the X-axis direction.

The plurality of power lines VL may supply the power voltage received from the display driver 200 to the plurality of pixels SP. Here, the power voltage may be at least one of, for example, a driving voltage, an initialization voltage, a reference voltage, or a low potential voltage. The plurality of power lines VL may extend in the Y-axis direction and may be spaced apart from each other in the X-axis direction.

The non-display area NDA may surround the display area DA. The non-display area NDA may include a gate driver 210, fan-out lines FOL, and gate control lines GCL. The gate driver 210 may generate a plurality of gate signals based on the gate control signal, and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines DL.

The gate control line GCL may extend from the display driver 200 to the gate driver 210. The gate control line GCL may supply the gate control signal received from the display driver 200 to the gate driver 210.

The sub-region SBA may include the display driver 200, a display pad area DPA, and first and second touch pad areas TPA1 and TPA2.

The display driver 200 may output signals and voltages that drive the display panel 100 to the fan-out lines FOL. The display driver 200 may supply a data voltage to the data line DL through the fan-out lines FOL. The data voltage may be supplied to the plurality of pixels SP to determine the luminance of the plurality of pixels SP. The display driver 200 may supply the gate control signal to the gate driver 210 through the gate control line GCL.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as, for example, an anisotropic conductive film or self assembly anisotropic conductive paste (SAP).

The display pad area DPA may include a plurality of display pad units DP. The plurality of display pad units DP may be connected to a graphic system through the circuit board 300. The plurality of display pad units DP may be connected to the circuit board 300 and may receive digital video data, and may supply the digital video data to the display driver 200.

Figure 4:
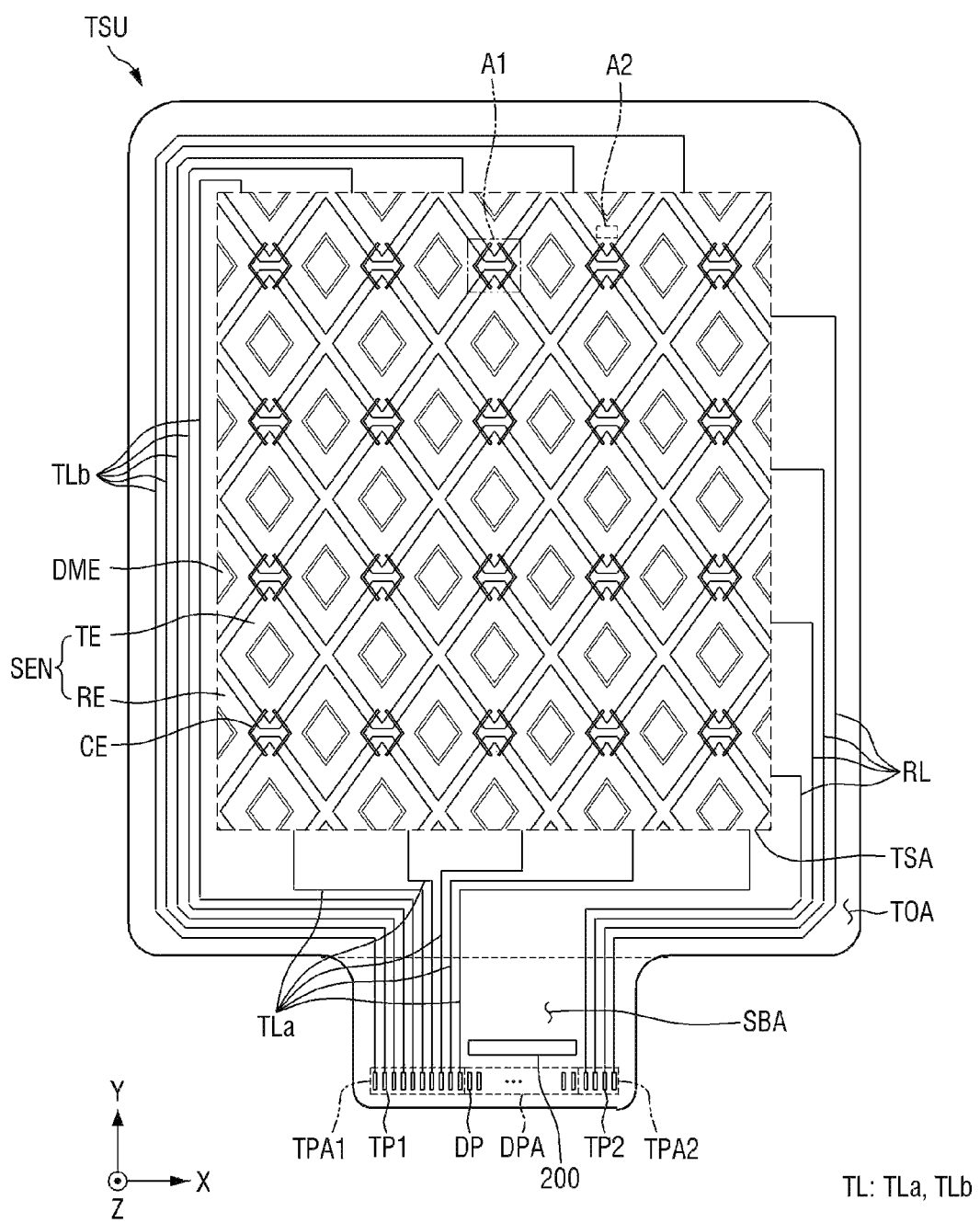
FIG. 4 is a plan view illustrating a touch sensing unit of a display device according to an embodiment.

FIG. 4 is a plan view illustrating a touch sensing unit of a display device according to an embodiment.

Referring to FIG. 4, the touch sensing unit TSU may include a touch sensor area TSA in which a user's touch is sensed, and a touch peripheral area TOA disposed around the touch sensor area TSA. The touch sensor area TSA may overlap the display area DA of the display unit DU, and the touch peripheral area TOA may overlap the non-display area NDA of the display unit DU.

The touch sensor area TSA may include a plurality of touch electrodes SEN and a plurality of dummy electrodes DME. The plurality of touch electrodes SEN may form mutual capacitance or self-capacitance to sense a touch of an object or a person. The plurality of touch electrodes SEN may include a plurality of driving electrodes TE and a plurality of sensing electrodes RE.

The plurality of driving electrodes TE may be arranged in the X-axis direction and the Y-axis direction. The plurality of driving electrodes TE may be spaced apart from each other in the X-axis direction and the Y-axis direction. The driving electrodes TE adjacent in the Y-axis direction may be electrically connected through a bridge electrode CE.

The plurality of driving electrodes TE may be connected to a first touch pad unit TP1 through a driving line TL. The driving line TL may include a lower driving line TLa and an upper driving line TLb. For example, the driving electrodes TE disposed under the touch sensor area TSA may be connected to the first touch pad unit TP1 through the lower driving line TLa, and the driving electrodes TE disposed on the upper side of the touch sensor area TSA may be connected to the first touch pad unit TP1 through the upper driving line TLb. The lower driving line TLa may extend to the first touch pad unit TP1 through the lower side of the touch peripheral area TOA. The upper driving line TLb may extend to the first touch pad unit TP1 through the upper side, the left side, and the lower side of the touch peripheral area TOA. The first touch pad unit TP1 may be connected to the touch driver 400 through the circuit board 300.

The bridge electrode CE may be bent at least once. For example, the bridge electrode CE may have an angle bracket shape ("<" or ">"), but the planar shape of the bridge electrode CE is not limited thereto. The driving electrodes TE disposed adjacent to each other in the Y-axis direction may be connected by a plurality of bridge electrodes CE, and although any one of the bridge electrodes CE is disconnected, the driving electrodes TE may be stably connected through the remaining bridge electrode(s) CE. The driving electrodes TE disposed adjacent to each other may be connected by two bridge electrodes CE, but the number of bridge electrodes CE is not limited thereto.

The bridge electrode CE may be disposed on a different layer than the plurality of driving electrodes TE and the plurality of sensing electrodes RE. The sensing electrodes RE disposed adjacent to each other in the X-axis direction may be electrically connected through a connection portion disposed on the same layer as the plurality of driving electrodes TE or the plurality of sensing electrodes RE, and the driving electrodes TE disposed adjacent in the Y-axis direction may be electrically connected through the bridge electrode CE disposed on a different layer than the plurality of driving electrodes TE or the plurality of sensing electrodes RE. Accordingly, although the bridge electrode CE overlaps the plurality of sensing electrodes RE in the Z-axis direction, the plurality of driving electrodes TE and the plurality of sensing electrodes RE may be insulated from each other. Mutual capacitance may be formed between the driving electrode TE and the sensing electrode RE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE disposed adjacent in the X-axis direction may be electrically connected through a connection portion.

The plurality of sensing electrodes RE may be connected to a second touch pad unit TP2 through a sensing line RL. For example, some of the sensing electrodes RE disposed on the right side of the touch sensor area TSA may be connected to the second touch pad unit TP2 through the sensing line RL. The sensing line RL may extend to the second touch pad unit TP2 through the right side and the lower side of the touch peripheral area TOA. The second touch pad unit TP2 may be connected to the touch driver 400 through the circuit board 300.

Each of the plurality of dummy electrodes DME may be surrounded by the driving electrode TE or the sensing electrode RE. Each of the dummy electrodes DME may be insulated by being spaced apart from the driving electrode TE or the sensing electrode RE. Accordingly, the dummy electrode DME may be electrically floating.

The display pad area DPA, the first touch pad area TPA1, and the second touch pad area TPA2 may be disposed at the edge of the sub-region SBA. The display pad area DPA, the first touch pad area TPA1, and the second touch pad area TPA2 may be electrically connected to the circuit board 300 by using a low-resistance high-reliability material such as, for example, an anisotropic conductive film or self-assembly anisotropic conductive paste (SAP).

The first touch pad area TPA1 may be disposed on one side of the display pad area DPA, and may include a plurality of first touch pad units TP1. The plurality of first touch pad units TP1 may be electrically connected to the touch driver 400 disposed on the circuit board 300. The plurality of first touch pad units TP1 may supply a touch driving signal to the plurality of driving electrodes TE through a plurality of driving lines TL.

The second touch pad area TPA2 may be disposed on the other side of the display pad area DPA, and may include a plurality of second touch pad units TP2. The plurality of second touch pad units TP2 may be electrically connected to the touch driver 400 disposed on the circuit board 300. The touch driver 400 may receive a touch sensing signal through a plurality of sensing lines RL connected to the plurality of second touch pad units TP2, and may sense a change in mutual capacitance between the driving electrode TE and the sensing electrode RE. As another example, the touch driver 400 may supply a touch driving signal to each of the plurality of driving electrodes TE and the plurality of sensing electrodes RE, and may receive a touch sensing signal from each of the plurality of driving electrodes TE and the plurality of sensing electrodes RE. The touch driver 400 may sense an amount of change in electric charge of each of the plurality of driving electrodes TE and the plurality of sensing electrodes RE based on the touch sensing signal.

Figure 5:
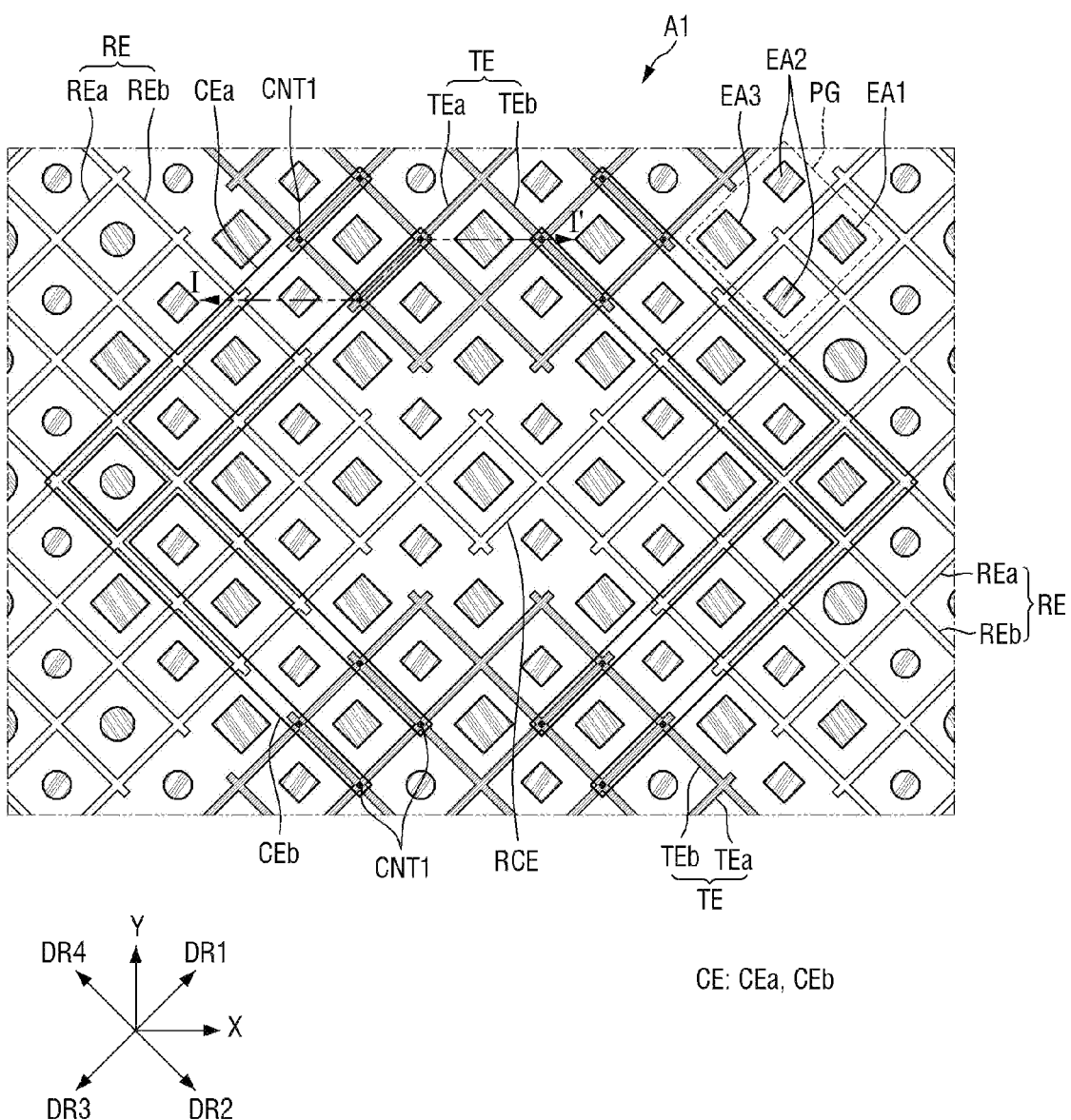
FIG. 5 is an enlarged view of area A1 of FIG. 4 according to an embodiment.

FIG. 5 is an enlarged view of area A1 of FIG. 4 according to an embodiment.

Referring to FIG. 5, the plurality of driving electrodes TE, the plurality of sensing electrodes RE, and the plurality of dummy electrodes DME may be disposed on the same layer and may be spaced apart from each other.

The plurality of driving electrodes TE may be arranged in the X-axis direction and the Y-axis direction. The plurality of driving electrodes TE may be spaced apart from each other in the X-axis direction and the Y-axis direction. The driving electrodes TE disposed adjacent in the Y-axis direction may be electrically connected through a bridge electrode CE.

The plurality of sensing electrodes RE may extend in the X-axis direction and may be spaced apart from each other in the Y-axis direction. The plurality of sensing electrodes RE may be arranged in the X-axis direction and the Y-axis direction, and the sensing electrodes RE disposed adjacent in the X-axis direction may be electrically connected through a connection portion RCE. For example, the connection portion RCE of the sensing electrodes RE may be disposed within the shortest distance between the driving electrodes TE disposed adjacent to each other.

The plurality of bridge electrodes CE may be disposed on a different layer from the driving electrode TE and the sensing electrode RE. The bridge electrode CE may include a first portion CEa and a second portion CEb. For example, the first portion CEa of the bridge electrode CE may be connected to the driving electrode TE disposed on one side through a first contact hole CNT1 and extend in a third direction DR3. The second portion CEb of the bridge electrode CE may be bent from the first portion CEa in an area overlapping the sensing electrode RE to extend in a second direction DR2, and may be connected to the driving electrode TE disposed on the other side through the first contact hole CNT1. Hereinafter, a first direction DR1 may be a direction between the X-axis direction and the Y-axis direction, a second direction DR2 may be a direction between the opposite direction of the Y-axis and the X-axis direction, a third direction DR3 may be an opposite direction of the first direction DR1, and a fourth direction DR4 may be an opposite direction of the second direction DR2. Accordingly, each of the plurality of bridge electrodes CE may electrically connect the adjacent driving electrodes TE in the Y-axis direction.

For example, the plurality of driving electrodes TE, the plurality of sensing electrodes RE, and the plurality of dummy electrodes DME may be formed in a planar mesh structure. The plurality of driving electrodes TE, the plurality of sensing electrodes RE, and the plurality of dummy electrodes DME may surround each of first to third emission areas EA1, EA2, and EA3 of a pixel group PG in a plan view. Accordingly, in an embodiment, the plurality of driving electrodes TE, the plurality of sensing electrodes RE, and the plurality of dummy electrodes DME do not overlap the first to third emission areas EA1, EA2, and EA3. In an embodiment, the plurality of bridge electrodes CE also do not overlap the first to third emission areas EA1, EA2, and EA3. Accordingly, the display device 10 may prevent or reduce the luminance of light emitted from the first to third emission areas EA1, EA2, and EA3 from being reduced by the touch sensing unit TSU.

Each of the plurality of driving electrodes TE may include a first portion TEa extending in the first direction DR1 and a second portion TEb extending in the second direction DR2. Each of the plurality of sensing electrodes RE may include a first portion REa extending in the first direction DR1 and a second portion REb extending in the second direction DR2.

The plurality of pixels may include first to third pixels, and each of the first to third pixels may include the first to third emission areas EA1, EA2, and EA3. For example, the first emission area EA1 may emit light of a first color (e.g., red light), the second emission area EA2 may emit light of a second color (e.g., green light), and the third emission area EA3 may emit light of a third color (e.g., blue light), but embodiments are not limited thereto. For example, in an embodiment, the first emission area EA1 may include a first light emitting element that emits light of a first color (e.g., red light), the second emission area EA2 may include a second light emitting element that emits light of a second color (e.g., green light), and the third emission area EA3 may include a third light emitting element that emits light of a third color (e.g., blue light).

One pixel group PG may represent white gray scale by including one first emission area EA1, two second emission areas EA2, and one third emission area EA3, but the configuration of the pixel group PG is not limited thereto. The white gray scale may be represented by a combination of light emitted from one first emission area EA1, light emitted from two second emission areas EA2, and light emitted from one third emission area EA3.

The first to third emission areas EA1, EA2, and EA3 may be different in size from each other. For example, the size of the third emission area EA3 may be larger than that of the first emission area EA1, and the size of the first emission area EA1 may be larger than that of the second emission area EA2. However, the present disclosure is not limited thereto. As another example, the sizes of the first to third emission areas EA1, EA2, and EA3 may be about the same as one another.

Figure 6:
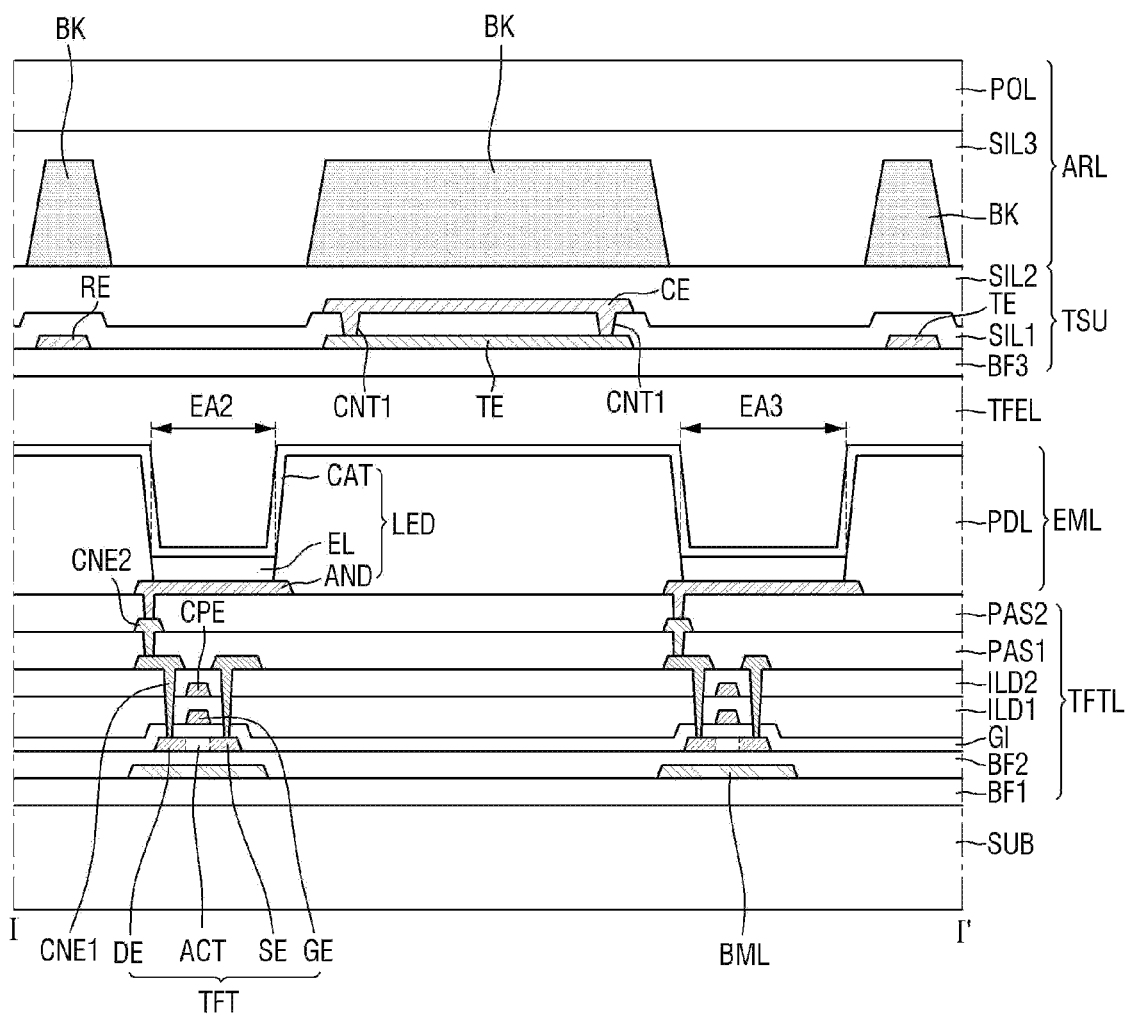
FIG. 6 is a cross-sectional view taken along line I-I' of FIG. 5 according to an embodiment.

FIG. 6 is a cross-sectional view taken along line I-I' of FIG. 5 according to an embodiment.

Referring to FIG. 6, the display panel 100 may include a display unit DU, a touch sensing unit TSU, and an antireflection layer ARL. The display unit DU may include a substrate SUB, a thin film transistor layer TFTL, a light emitting element layer EML, and an encapsulation layer TFEL.

The substrate SUB may be a base substrate or a base member. The substrate SUB may be a flexible substrate which can be bent, folded or rolled. For example, the substrate SUB may include a polymer resin such as polyimide (PI), but is not limited thereto. For another example, the substrate SUB may include a glass material or a metal material.

The thin film transistor layer TFTL may include a first buffer layer BF1, a light blocking layer BML, a second buffer layer BF2, a thin film transistor TFT, a gate insulating layer GI, a first interlayer insulating layer ILD1, a capacitor electrode CPE, a second interlayer insulating layer ILD2, a first connection electrode CNE1, a first passivation layer PAS1, a second connection electrode CNE2, and a second passivation layer PAS2.

The first buffer layer BF1 may be disposed on the substrate SUB. The first buffer layer BF1 may include an inorganic layer capable of preventing or reducing penetration of air or moisture. For example, the first buffer layer BF1 may include a plurality of inorganic layers alternately stacked with one another.

A light blocking layer BML may be disposed on the first buffer layer BF1. For example, the light blocking layer BML may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. For another example, the light blocking layer BML may be an organic layer including a black pigment.

The second buffer layer BF2 may cover the first buffer layer BF1 and the light blocking layer BML. The second buffer layer BF2 may include an inorganic layer capable of preventing or reducing penetration of air or moisture. For example, the second buffer layer BF2 may include a plurality of inorganic layers alternately stacked.

The thin film transistor TFT may be disposed on the second buffer layer BF2, and may constitute a pixel circuit of each of a plurality of pixels. For example, the thin film transistor TFT may be a switching transistor or a driving transistor of the pixel circuit. The thin film transistor TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap the light blocking layer BML, in a thickness direction. The semiconductor region ACT may overlap the gate electrode GE in the thickness direction, and may be insulated from the gate electrode GE by the gate insulating layer GI. The source electrode SE and the drain electrode DE may be provided by utilizing a conductive material as the material of the semiconductor region ACT.

The gate electrode GE may be disposed on the gate insulating layer GI. The gate electrode GE may overlap the semiconductor region ACT with the gate insulating layer GI interposed therebetween.

The gate electrode GE may be disposed on the gate insulating layer GI. For example, the gate insulating layer GI may cover the semiconductor region ACT, the source electrode SE, the drain electrode DE, and the second buffer layer BF2, and may insulate the semiconductor region ACT from the gate electrode GE. The gate insulating layer GI may include a contact hole through which the first connection electrode CNE1 passes.

The first interlayer insulating layer ILD1 may cover the gate electrode GE and the gate insulating layer GI. The first interlayer insulating layer ILD1 may include a contact hole through which the first connection electrode CNE1 passes. The contact hole of the first interlayer insulating layer ILD1 may be connected to the contact hole of the gate insulating layer GI and the contact hole of the second interlayer insulating layer ILD2.

The capacitor electrode CPE may be disposed on the first interlayer insulating layer ILD1. The capacitor electrode CPE may overlap the gate electrode GE in the thickness direction. The capacitor electrode CPE and the gate electrode GE may form a capacitance.

The second interlayer insulating layer ILD2 may cover the capacitor electrode CPE and the first interlayer insulating layer ILD1. The second interlayer insulating layer ILD2 may include a contact hole through which the first connection electrode CNE1 passes. The contact hole of the second interlayer insulating layer ILD2 may be connected to the contact hole of the first interlayer insulating layer ILD1 and the contact hole of the gate insulating layer GI.

The first connection electrode CNE1 may be disposed on the second interlayer insulating layer ILD2. The first connection electrode CNE1 may electrically connect the drain electrode DE of the thin film transistor TFT to the second connection electrode CNE2. The first connection electrode CNE1 may be inserted into a contact hole provided in the second interlayer insulating layer ILD2, the first interlayer insulating layer ILD1, and the gate insulating layer GI to be in contact with the drain electrode DE of the thin film transistor TFT.

The first passivation layer PAS1 may cover the first connection electrode CNE1 and the second interlayer insulating layer ILD2. The first passivation layer PAS1 may protect the thin film transistor TFT. The first passivation layer PAS1 may include a contact hole through which the second connection electrode CNE2 passes.

The second connection electrode CNE2 may be disposed on the first passivation layer PAS1. The second connection electrode CNE2 may electrically connect the first connection electrode CNE1 to a pixel electrode AND of the light emitting element LED. The second connection electrode CNE2 may be inserted into a contact hole provided in the first passivation layer PAS1 to be in contact with the first connection electrode CNE1.

The second passivation layer PAS2 may cover the second connection electrode CNE2 and the first passivation layer PAS1. The second passivation layer PAS2 may include a contact hole through which the pixel electrode AND of the light emitting element LED passes.

The light emitting element layer EML may be disposed on the thin film transistor layer TFTL. The light emitting element layer EML may include the light emitting element LED and a pixel defining layer PDL. The light emitting element LED may include a pixel electrode AND, a light emitting layer EL, and a common electrode CAT.

The pixel electrode AND may be disposed on the second passivation layer PAS2. The pixel electrode AND may overlap one of the first to third emission areas EA1, EA2, and EA3 defined by the pixel defining layer PDL. The pixel electrode AND may be electrically connected to the drain electrode DE of the thin film transistor TFT through the first and second connection electrodes CNE1 and CNE2.

The light emitting layer EL may be disposed on the pixel electrode AND. For example, the light emitting layer EL may be an organic light emitting layer made of an organic material, but is not limited thereto. In the case of employing the organic light emitting layer as the light emitting layer EL, the thin film transistor TFT applies a predetermined voltage to the pixel electrode AND of the light emitting element LED, and if the common electrode CAT of the light emitting element LED receives a common voltage or a cathode voltage, the holes and electrons can move to the light emitting layer EL through the hole transport layer and the electron transport layer and combine to produce light to be emitted by the light emitting layer EL.

The common electrode CAT may be arranged on the light emitting layer EL. For example, the common electrode CAT may be made in the form of an electrode common to all of the pixels rather than specific to each of the pixels. The common electrode CAT may be disposed on the light emitting layer EL in the first to third emission areas EA1, EA2, and EA3, and may be disposed on the pixel defining layer PDL in an area other than the first to third emission areas EA1, EA2, and EA3.

The common electrode CAT may receive the common voltage or a low potential voltage. In a case in which the pixel electrode AND receives a voltage corresponding to a data voltage and the common electrode CAT receives the low potential voltage, a potential difference is formed between the pixel electrode AND and the common electrode CAT, so that the light emitting layer EL may emit light.

The pixel defining layer PDL may define the first to third emission areas EA1, EA2, and EA3. The pixel defining layer PDL may separate and insulate the pixel electrode AND of each of the plurality of light emitting elements ED. The pixel defining layer PDL may include a light absorbing material. The pixel defining layer PDL may prevent or reduce light reflection.

The encapsulation layer TFEL may be disposed on the common electrode CAT and may cover the plurality of light emitting elements LED. The encapsulation layer TFEL may include at least one inorganic layer which may prevent oxygen or moisture from penetrating into the light emitting element layer EML. The encapsulation layer TFEL may include at least one organic layer which may protect the light emitting element layer EML from foreign matter such as, for example, dust.

The touch sensing unit TSU may be disposed on the encapsulation layer TFEL. The touch sensing unit TSU may include a third buffer layer BF3, the bridge electrode CE, a first insulating layer SIL1, the driving electrode TE, the sensing electrode RE, and a second insulating layer SIL2.

The third buffer layer BF3 may be disposed on the encapsulation layer TFEL. The third buffer layer BF3 may have an insulating and optical function. The third buffer layer BF3 may include at least one inorganic layer. In an embodiment, the third buffer layer BF3 may be omitted.

The driving electrode TE and the sensing electrode RE may be disposed on the third buffer layer BF3. In an embodiment, each of the driving electrode TE and the sensing electrode RE do not overlap the first to third emission areas EA1, EA2, and EA3. Each of the driving electrode TE and the sensing electrode RE may be formed of a single layer containing, for example, molybdenum (Mo), titanium (Ti), copper (Cu), aluminum (Al), or indium tin oxide (ITO), or may be formed to have a stacked structure (Ti/Al/Ti) of, for example, aluminum and titanium, a stacked structure (ITO/Al/ITO) of aluminum and ITO, an Ag—Pd—Cu (APC) alloy, or a stacked structure (ITO/APC/ITO) of APC alloy and ITO.

The first insulating layer SIL1 may cover the driving electrode TE, the sensing electrode RE, and the third buffer layer BF3. The first insulating layer SIL1 may have an insulating function and an optical function. For example, the first insulating layer SIL1 may be an inorganic layer containing at least one of a silicon nitride layer, a silicon oxynitride layer, a silicon oxide layer, a titanium oxide layer, or an aluminum oxide layer. In another example, the first insulating layer SIL1 may include an organic film.

The bridge electrode CE may be disposed on the first insulating layer SIL1. The bridge electrode CE may be disposed on a different layer from the driving electrode TE and the sensing electrode RE and may electrically connect the driving electrodes TE disposed adjacent to each other in the Y-axis direction.

The second insulating layer SIL2 may cover the bridge electrode CE and the first insulating layer SIL1. The second insulating layer SIL2 may have an insulating function and an optical function. The second insulating layer SIL2 may have an insulating function and an optical function. The second insulating layer SIL2 may be made of the material exemplified in association with the first insulating layer SIL1.

The antireflection layer ARL may be disposed on the touch sensing unit TSU. The antireflection layer ARL may include a light blocking part BK, a third insulating layer SIL3, and a polarizing film POL.

The light blocking part BK may be disposed on the second insulating layer SIL2. The light blocking part BK may prevent or reduce light reflection by the driving electrode TE and the sensing electrode RE by overlapping the driving electrode TE and the sensing electrode RE. The light blocking part BK may contain a light absorbing material. For example, the light blocking part BK may include an inorganic black pigment, an organic black pigment or an organic blue pigment. The inorganic black pigment may be a metal oxide such as, for example, carbon black or titanium black, the organic black pigment may include at least one of, for example, lactam black, perylene black, or aniline black and the organic blue pigment may be, for example, C.I. pigment blue, but embodiments are not limited thereto. The light blocking part BK may prevent or reduce visible light infiltration and color mixture between the first to third emission areas EA1, EA2, and EA3, which may result in an improvement of color reproducibility of the display device 10.

The third insulating layer SIL3 may cover the light blocking part BK and the second insulating layer SIL2. The third insulating layer SIL3 may have an insulating function and an optical function. The third insulating layer SIL3 may be made of the material exemplified in association with the first insulating layer SIL1.

The polarizing film POL may be disposed on the third insulating layer SIL3. The polarizing film POL may be attached onto the touch sensing unit TSU by an optically clear adhesive (OCA) film or an optically clear resin (OCR). For example, the polarizing film POL may include a linear polarizer plate and a phase retardation film, and the phase retardation film may be a quarter-wave ($\lambda/4$) plate. The phase retardation film and the linear polarizer plate may be sequentially stacked on the touch sensing unit TSU. The polarizing film POL can prevent or reduce color distortion caused by the reflection of the external light by reducing the reflected light of the external light.

Figure 7:
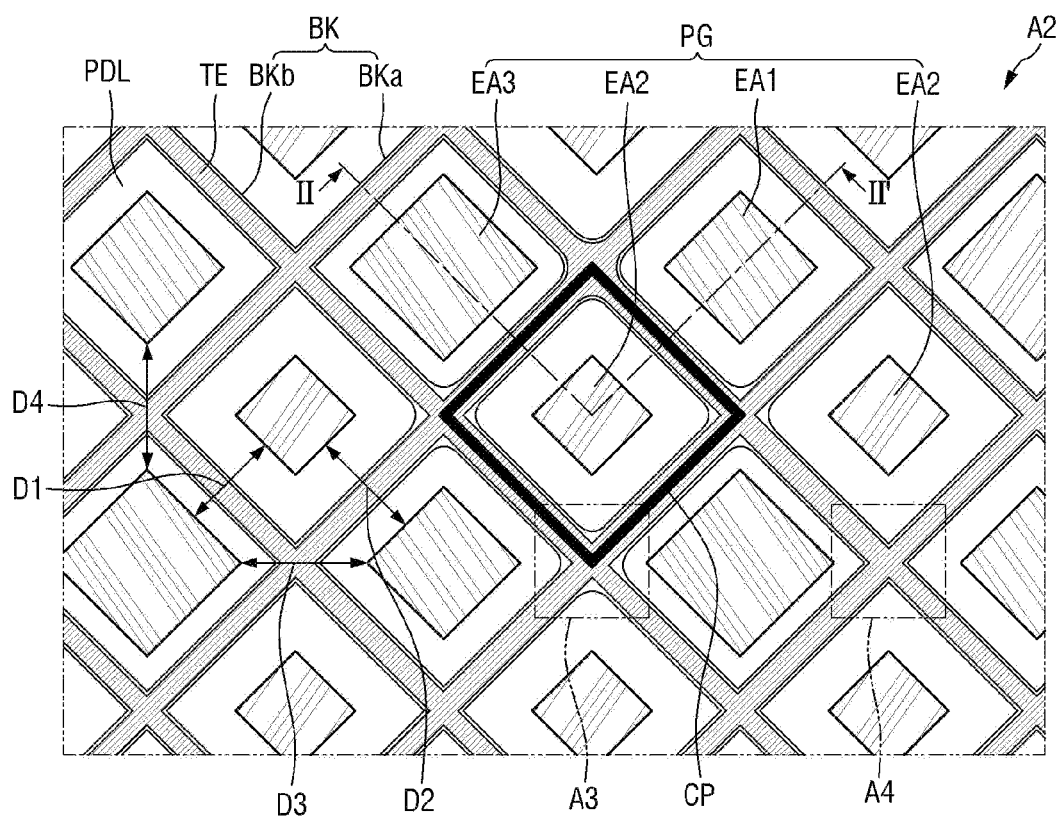
FIG. 7 is an enlarged view of A2 region of FIG. 4 according to an embodiment.
Figure 7:
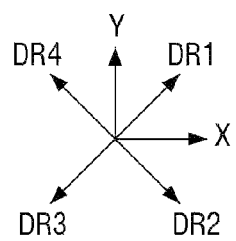
Figure 8:
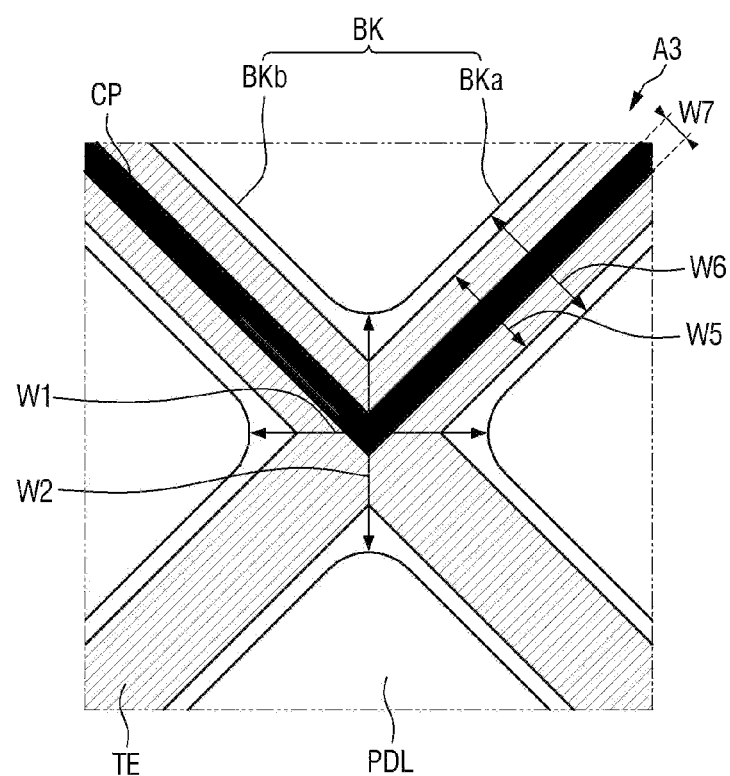
FIG. 8 is an enlarged view of A3 region of FIG. 7 according to an embodiment.
Figure 8:
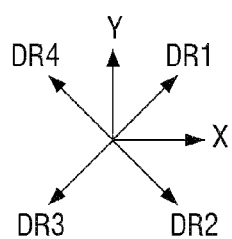
Figure 9:
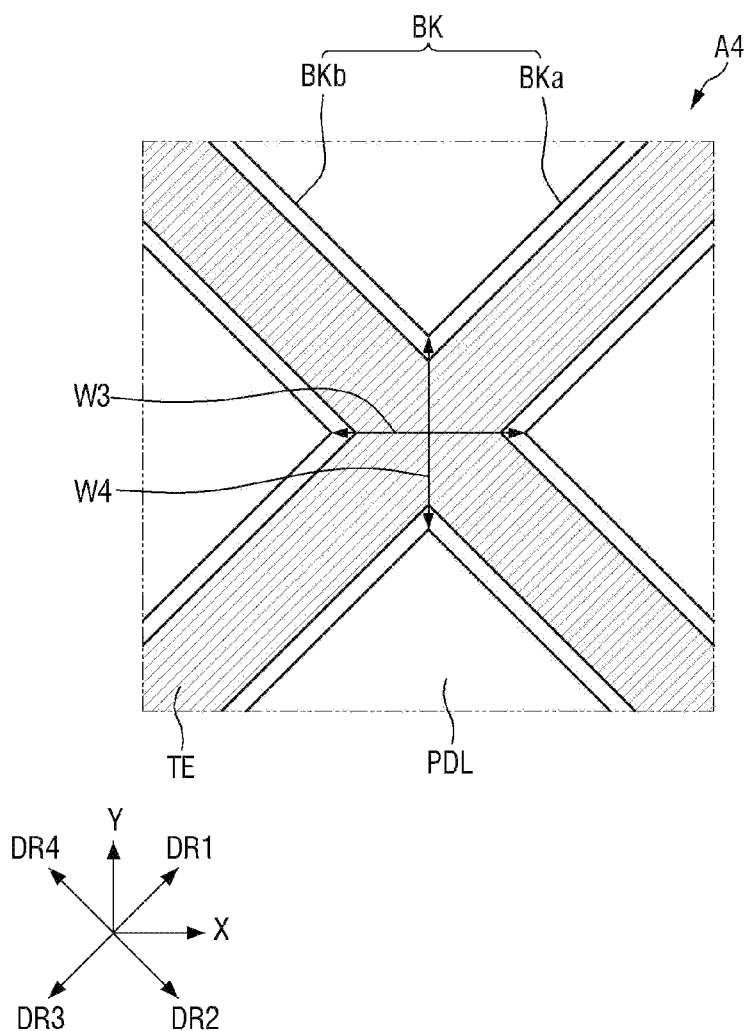
FIG. 9 is an enlarged view of A4 region of FIG. 7 according to an embodiment.
Figure 10:
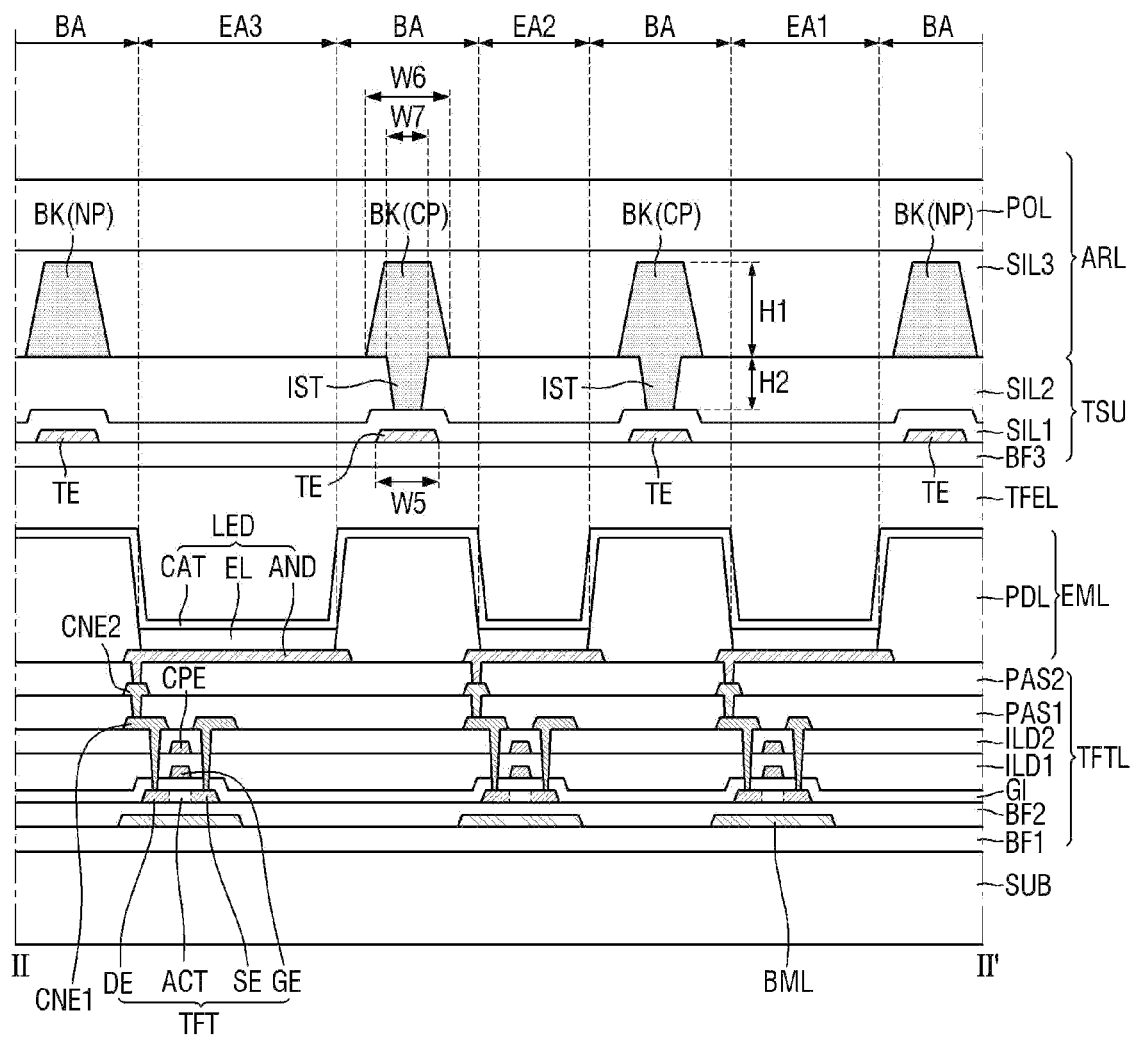
FIG. 10 is cross-sectional view taken along line II-II' of FIG. 7 according to an embodiment.

FIG. 7 is an enlarged view of region A2 of FIG. 4 according to an embodiment. FIG. 8 is an enlarged view of region A3 of FIG. 7 according to an embodiment. FIG. 9 is an enlarged view of region A4 of FIG. 7 according to an embodiment. FIG. 10 is a cross-sectional view taken along line of FIG. 7 according to an embodiment.

Hereinafter, for convenience of explanation, a further description of the same or similar configurations, elements, and technical aspects previously described will be only briefly described below, or a description thereof will be omitted.

Referring to FIGS. 7 to 10, the antireflection layer ARL may include the light blocking part BK, the third insulating layer SIL3 and the polarizing film POL.

The light blocking part BK may be disposed on the second insulating layer SIL2 in a light blocking area BA. The light blocking area BA may surround the first to third emission areas EA1, EA2, and EA3. The light blocking region BA may overlap the driving electrode TE, which may prevent or reduce the light reflection by the driving electrode TE. The light blocking part BK may contain a light absorbing material. For example, the light blocking part BK may include an inorganic black pigment, an organic black pigment or an organic blue pigment. The inorganic black pigment may be metal oxide such as, for example, carbon black or titanium black, the organic black pigment may include at least one of, for example, lactam black, perylene black, or aniline black, and the organic blue pigment may be, for example, C.I. pigment blue, but embodiments are not limited thereto. The light blocking part BK may prevent or reduce visible light infiltration and color mixture between the first to third emission areas EA1, EA2, and EA3, which may result in an improvement of color reproducibility of the display device 10.

By including an insertion portion IST that is inserted into the second insulating layer SIL2, a part of the light blocking part BK may form a code pattern CP and the other part of the light blocking part BK may form a non-code pattern NP that does not have the insertion portion IST. The insertion portion IST may be inserted into the second insulating layer SIL2 to be in contact with the upper surface of the first insulating layer SIL1. The code pattern CP and the non-code pattern NP may have a difference in reflectance with respect to light of a specific wavelength. A first height H1 may correspond to a length from the second insulating layer SIL2 to the upper surface of the light blocking part BK, and a second height H2 may correspond to a length from the second insulating layer SIL2 to the bottom surface of the insertion portion IST. The thickness of the code pattern CP may correspond to the sum of the first height H1 and the second height H2 and the thickness of the non-code pattern NP may correspond to the first height H1. For example, the first height H1 may be about 1 μm to about 1.5 μm, and the second height H2 may be about 0.5 μm or more. For another example, the first height H1 may be about 1.5 μm or more and the second height H2 may be about 0.5 μm or more. Accordingly, in an embodiment, the thickness of the code pattern CP may be greater than the thickness of the non-code pattern NP by about 0.5 μm and a predetermined difference in infrared reflectance may be secured. The infrared transmittance of the code pattern CP may be about 30% or less and the infrared transmittance of the non-code pattern NP may be about 45% or more, but the present disclosure is not limited thereto.

The light blocking part BK may have different infrared reflectance depending on the thickness. In an embodiment, the code pattern CP and the non-code pattern NP are not visually recognized since a difference in visible light reflectance is relatively small. Since the code pattern CP and the non-code pattern NP have a predetermined infrared reflectance difference, the code pattern CP can be distinguished from the non-code pattern NP in a case in which the infrared camera captures the light blocking part BK. Because the code pattern CP is photographed by the infrared camera, the image quality of the display device 10 may not be deteriorated.

The code pattern CP may surround at least one of the first to third emission areas EA1, EA2, and EA3. The code pattern CP may be formed in a planar mesh structure. In an embodiment, the code pattern CP does not overlap the first to third emission areas EA1, EA2, and EA3. Accordingly, the display device 10 may prevent or reduce the luminance of light emitted from the first to third emission areas EA1, EA2, and EA3 from being reduced by the light blocking part BK or the code pattern CP.

The third emission area EA3 and the second emission area EA2 disposed adjacent to each other in the first direction DR1 may be spaced apart from each other by a first distance D1. The first emission area EA1 and the second emission area EA2 disposed adjacent to each other in the second direction DR2 may be spaced apart from each other by a second distance D2. The first emission area EA1 and the third emission area EA3 disposed adjacent to each other in the X-axis direction may be spaced apart from each other by a third distance D3. The first emission area EA1 and the third emission area EA3 disposed adjacent to each other in the Y-axis direction may be spaced apart from each other by a fourth distance D4. The length of the third distance D3 may be greater than the first distance D1 or the second distance D2. The length of the fourth distance D4 may be greater than the first distance D1 or the second distance D2.

The light blocking part BK may include a first portion BKa extending in the first direction DR1 and a second portion BKb extending in the second direction DR2. In FIG. 8, in a case in which the intersection point of the first portion BKa and the second portion BKb of the light blocking part BK overlaps the code pattern CP, the width of the light blocking part BK may be relatively increased. In FIG. 9, in a case in which the intersection point of the first portion BKa and the second portion BKb of the light blocking part BK does not overlap the code pattern CP, the width of the light blocking part BK may be relatively reduced. Accordingly, the first width W1 of the light blocking part BK may be greater than the third width W3 of the light blocking part BK, and the second width W2 of the light blocking part BK may be greater than the fourth width W4 of the light blocking part BK.

A distance in the X-axis direction between the first emission area EA1 and the light blocking part BK may be greater than a distance in the second direction DR2 between the first emission area EA1 and the light blocking part BK. A distance in the Y-axis direction between the second emission area EA2 and the light blocking part BK may be greater than a distance in the second direction DR2 between the second emission area EA2 and the light blocking part BK. A distance in the X-axis direction between the third emission area EA3 and the light blocking part BK may be longer than a distance in the second direction DR2 between the third emission area EA3 and the light blocking part BK. Accordingly, even when the first width W1 and the second width W2 of the light blocking part BK increase at the intersection point of the first portion BKa and the second portion BKb overlapping the code pattern CP, the light blocking part BK may maintain a predetermined distance from the first to third emission areas EA1, EA2, and EA3. The display device 10 may prevent or reduce a reduction in the aperture ratio and overcome the risk of white angular dependence (WAD).

In an area excluding the intersection point, the driving electrode TE may have a fifth width W5, and the light blocking part BK may have a sixth width W6 greater than the fifth width W5. For example, the fifth width W5 may be about 3 μm to about 5 μm, and the sixth width W6 may be about 5 μm to about 7 μm, but is not limited thereto. The light blocking part BK may overlap the driving electrode TE, thereby preventing or reducing the light reflection by the driving electrode TE. For example, a width W7 of the code pattern CP may be smaller than the fifth width W5 of the driving electrode TE or the sixth width W6 of the light blocking part BK. For another example, the width W7 of the code pattern CP may be greater than the fifth width W5 of the driving electrode TE and smaller than the sixth width W6 of the light blocking part BK.

The code pattern CP may be disposed over the entire area of the display area DA, and each of the plurality of code patterns CP may have location information according to a specific reference. The code pattern CP may be photographed by a camera approaching the front of the display device 10 and may be identified through a photographed image or another image. At least one code pattern CP or a combination of the code patterns CP may correspond to a preset data code value. For example, the code pattern CP disposed at a specific location may correspond to a data code designated at the corresponding location.

As the display device 10 includes the plurality of code patterns CP determined by the planar shape of the light blocking part BK having the insertion portion IST, the display device may receive an input from an input device such as an input pen. Here, the input pen may be, for example, a smart pen, an electromagnetic pen, or an active pen, but is not limited thereto. At least one code pattern CP or a combination of the code patterns CP may have position information according to a specific criterion, and may correspond to a preset data code in a one-to-one correspondence. Accordingly, the display device 10 may receive coordinate data generated without complex calculation and correction by using the data code, thereby performing the corresponding function according to the correct input coordinates, which may reduce cost and power consumption and simplify a driving process. In addition, the display device 10 may include a code pattern CP incorporated in the touch sensing unit TSU, and thus is not limited in size and may be applied to all electronic devices according to embodiments.

Figure 11:
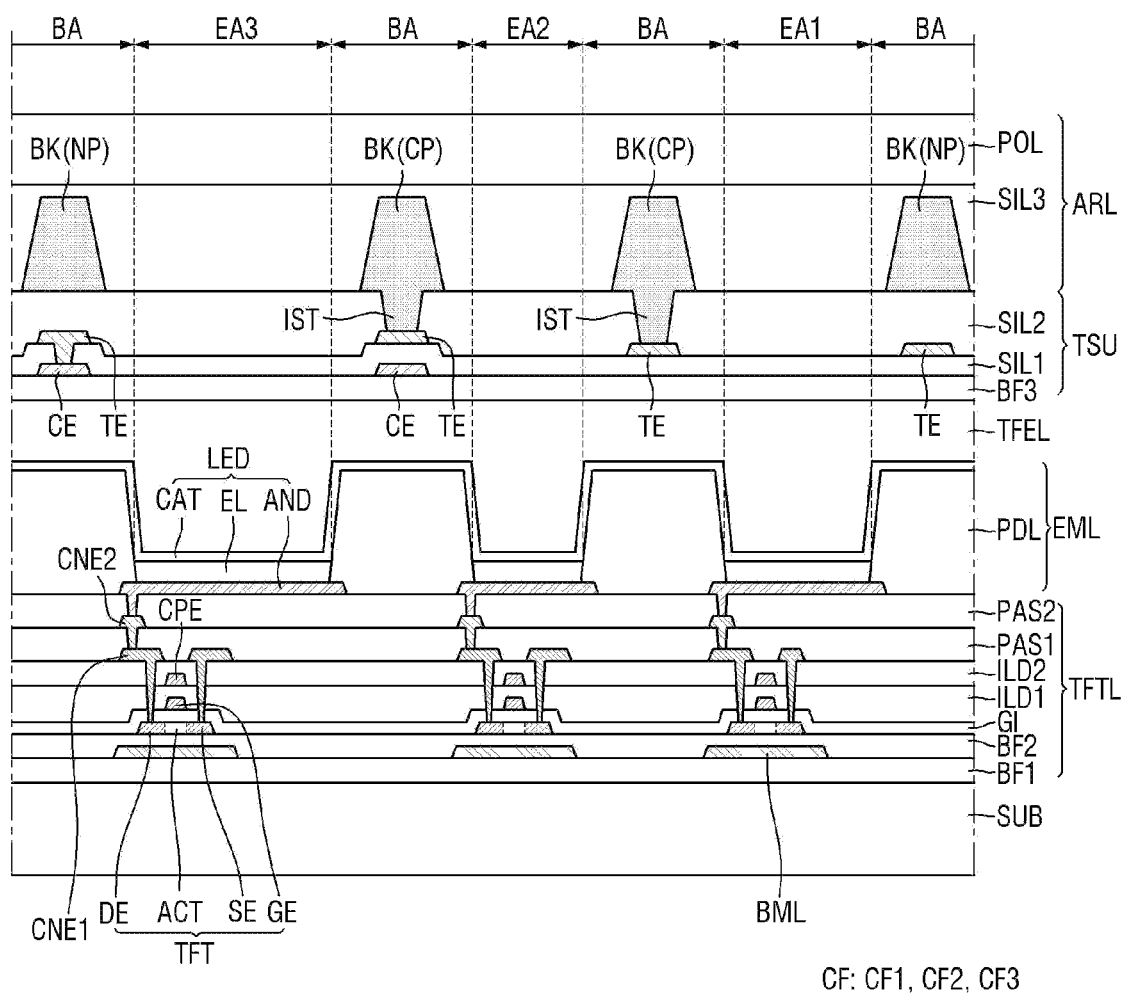
FIG. 11 is a cross-sectional view showing a display device according to an embodiment.

FIG. 11 is a cross-sectional view showing a display device according to an embodiment. The display device of FIG. 11 differs from the display device of FIG. 10 in the configuration of the touch sensing unit TSU, and for convenience of explanation, a further description of the same or similar configurations, elements, and technical aspects previously described will only be briefly described or will be omitted.

Referring to FIG. 11, the touch sensing unit TSU may include the third buffer layer BF3, a bridge electrode CE, a first insulating layer SIL1, a driving electrode TE and a second insulating layer SIL2. The antireflection layer ARL may include a light blocking part BK, a third insulating layer SIL3, and a polarizing film POL.

The bridge electrode CE may be disposed on the third buffer layer BF3. The bridge electrode CE may be disposed on a different layer from the driving electrode TE and the sensing electrode RE and may electrically connect the driving electrodes TE disposed adjacent to each other in the Y-axis direction.

The driving electrode TE may be disposed on the first insulating layer SIL1. In an embodiment, the driving electrode TE does not overlap the first to third emission areas EA1, EA2, and EA3. The driving electrode TE may be formed of a single layer containing, for example, molybdenum (Mo), titanium (Ti), copper (Cu), or aluminum (Al), indium tin oxide (ITO) or may be formed to have, for example, a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The light blocking part BK may be disposed on the second insulating layer SIL2. The light blocking part BK may overlap the driving electrode TE, which may prevent or reduce the light reflection by the driving electrode TE. The light blocking part BK may contain a light absorbing material. The light blocking part BK may prevent or reduce visible light infiltration and color mixture between the first to third emission areas EA1, EA2, and EA3, which may result in an improvement of color reproducibility of the display device 10.

By including an insertion portion IST that is inserted into the second insulating layer SIL2, a part of the light blocking part BK may form a code pattern CP and the other part of the light blocking part BK may form a non-code pattern NP that does not have the insertion portion IST. The thickness of the code pattern CP may be greater by about 0.5 μm than the thickness of the non-code pattern NP and a predetermined difference in infrared reflectance may be secured. The infrared transmittance of the code pattern CP may be about 30% or less and the infrared transmittance of the non-code pattern NP may be about 45% or more, but the present disclosure is not limited thereto.

The light blocking part BK may have different infrared reflectance depending on the thickness. In an embodiment, the code pattern CP and the non-code pattern NP are not visually recognized since a difference in visible light reflectance is relatively small. Since the code pattern CP and the non-code pattern NP have a predetermined infrared reflectance difference, the code pattern CP can be distinguished from the non-code pattern NP in a case in which the infrared camera captures the light blocking part BK. Because the code pattern CP is photographed by the infrared camera, deterioration of the image quality of the display device 10 may be prevented or reduced.

Figure 12:
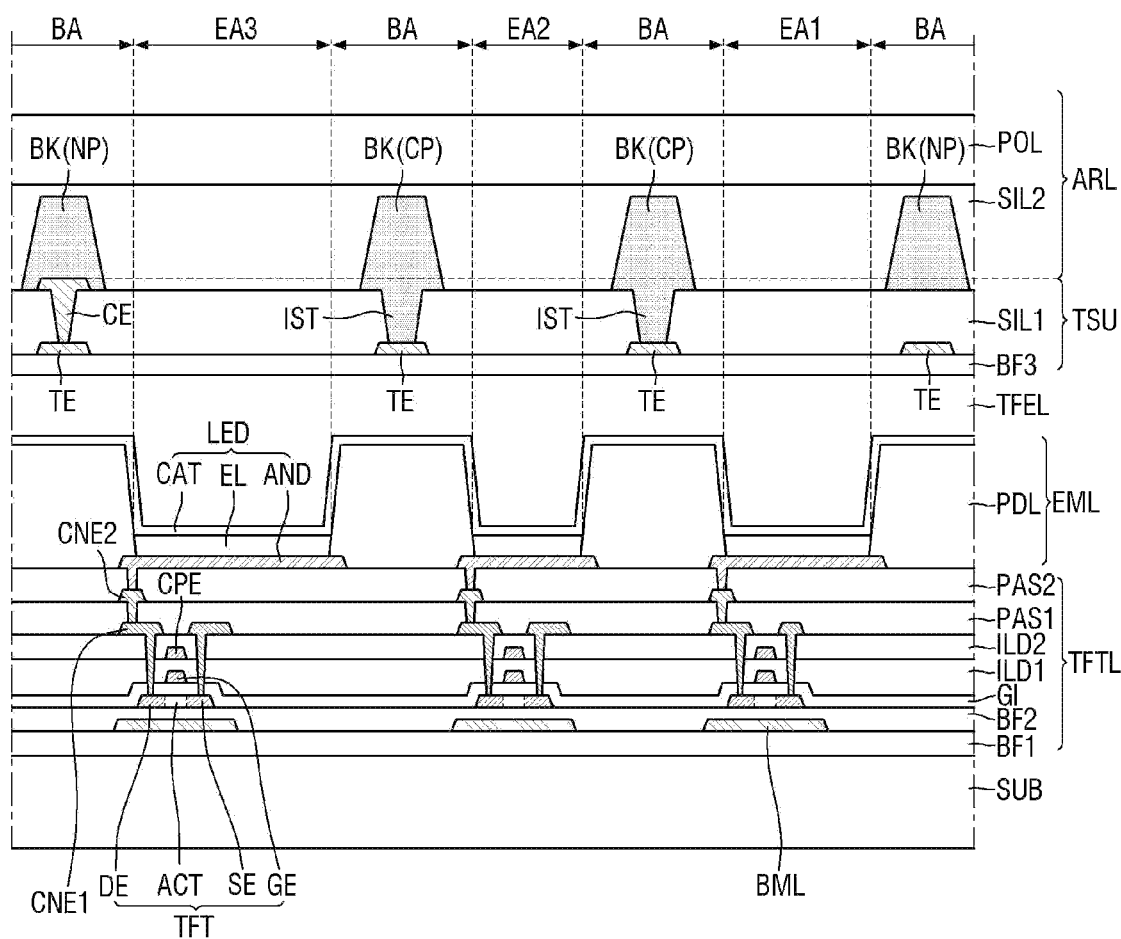
FIG. 12 is a cross-sectional view showing a display device according to an embodiment.

FIG. 12 is a cross-sectional view showing a display device according to an embodiment. The display device of FIG. 12 differs from the display device of FIG. 10 in the configuration of the touch sensing unit TSU, and for convenience of explanation, a further description of the same or similar configurations, elements, and technical aspects previously described will only be briefly described or will be omitted.

Referring to FIG. 12, the touch sensing unit TSU may include the third buffer layer BF3, a driving electrode TE, a first insulating layer SIL1 and a bridge electrode CE. The antireflection layer ARL may include a light blocking part BK, a second insulating layer SIL2 and a polarizing film POL.

The driving electrode TE may be disposed on the third buffer layer BF3. In an embodiment, the driving electrode TE does not overlap the first to third emission areas EA1, EA2, and EA3. The driving electrode TE may be formed of a single layer containing, for example, molybdenum (Mo), titanium (Ti), copper (Cu), or aluminum (Al), indium tin oxide (ITO), or may be formed to have, for example, a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The bridge electrode CE may be disposed on the first insulating layer SIL1. The bridge electrode CE may be disposed on a different layer from the driving electrode TE and the sensing electrode RE and may electrically connect the driving electrodes TE disposed adjacent to each other in the Y-axis direction.

The light blocking part BK may be disposed on the first insulating layer SIL1. A part of the light blocking part BK may cover the bridge electrode CE. The light blocking part BK may overlap the driving electrode TE, which may prevent or reduce the light reflection by the driving electrode TE. The light blocking part BK may contain a light absorbing material. The light blocking part BK may prevent or reduce visible light infiltration and color mixture between the first to third emission areas EA1, EA2, and EA3, which may result in an improvement of color reproducibility of the display device 10.

By including an insertion portion IST that is inserted into the first insulating layer SIL1, a part of the light blocking part BK may form a code pattern CP and the other part of the light blocking part BK may form a non-code pattern NP that does not have the insertion portion IST. The thickness of the code pattern CP may be greater by about 0.5 μm than the thickness of the non-code pattern NP and a predetermined difference in infrared reflectance may be secured. The infrared transmittance of the code pattern CP may be about 30% or less and the infrared transmittance of the non-code pattern NP may be about 45% or more, but the present disclosure is not limited thereto.

The light blocking part BK may have different infrared reflectance depending on the thickness. In an embodiment, the code pattern CP and the non-code pattern NP are not visually recognized since a difference in visible light reflectance is relatively small. Since the code pattern CP and the non-code pattern NP have a predetermined infrared reflectance difference, the code pattern CP can be distinguished from the non-code pattern NP in a case in which the infrared camera captures the light blocking part BK. Because the code pattern CP is photographed by the infrared camera, deterioration of the image quality of the display device 10 may be prevented or reduced.

Figure 13:
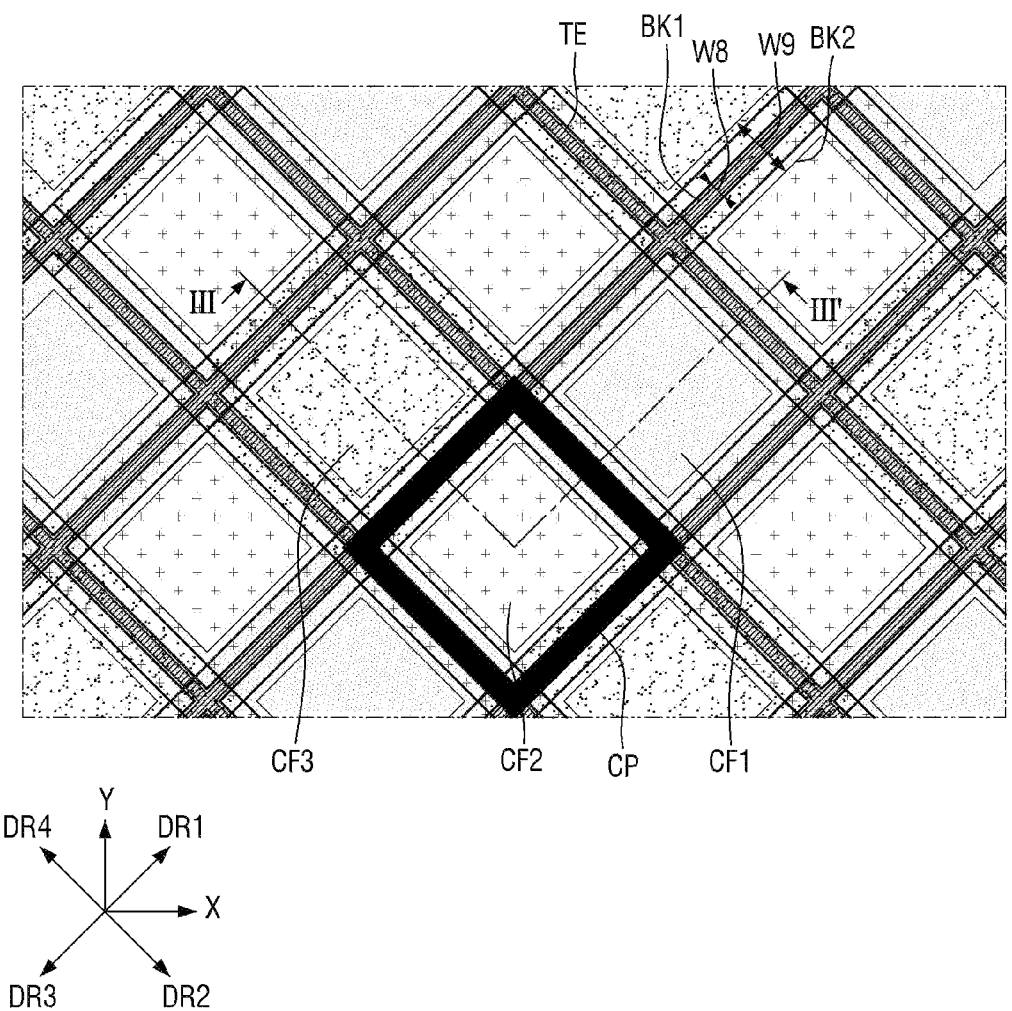
FIG. 13 is a plan view illustrating a touch sensing unit of a display device according to an embodiment.
Figure 14:
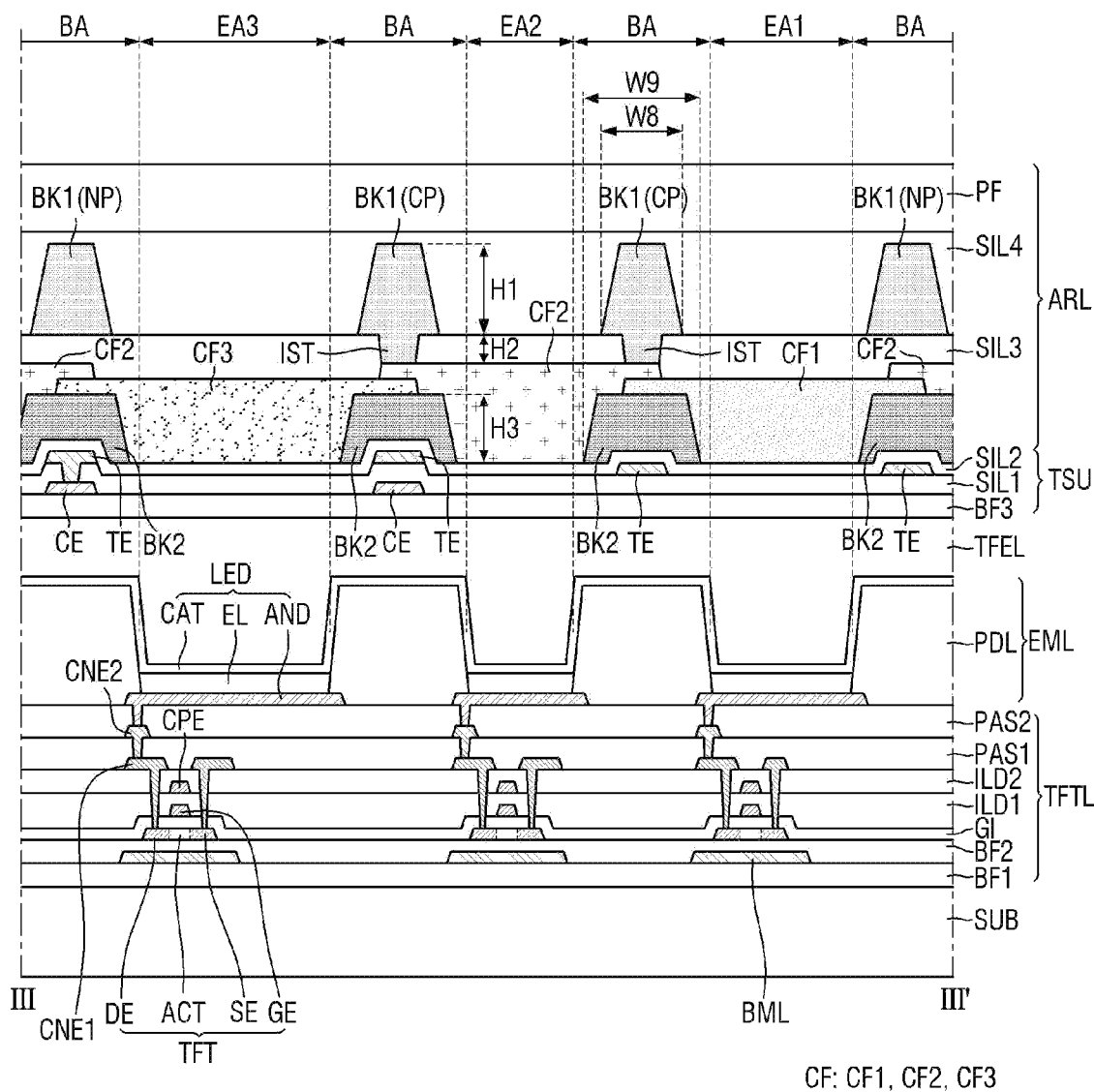
FIG. 14 is a cross-sectional view taken along line of FIG. 13 according to an embodiment.

FIG. 13 is a plan view illustrating a touch sensing unit of a display device according to an embodiment. FIG. 14 is a cross-sectional view taken along line of FIG. 13 according to an embodiment.

Referring to FIGS. 13 and 14, the touch sensing unit TSU may include a third buffer layer BF3, a bridge electrode CE, a first insulating layer SIL1, a driving electrode TE and a second insulating layer SIL2.

The bridge electrode CE may be disposed on the third buffer layer BF3. The bridge electrode CE may be disposed on a different layer from the driving electrode TE and the sensing electrode RE and may electrically connect the driving electrodes TE disposed adjacent to each other in the Y-axis direction.

The first insulating layer SIL1 may cover the bridge electrode CE and the third buffer layer BF3. The first insulating layer SIL1 may have an insulating and optical function. For example, the first insulating layer SIL1 may be an inorganic layer containing at least one of a silicon nitride layer, a silicon oxynitride layer, a silicon oxide layer, a titanium oxide layer, or an aluminum oxide layer. In another example, the first insulating layer SIL1 may include an organic film.

The driving electrode TE may be disposed on the first insulating layer SIL1. In an embodiment, the driving electrode TE does not overlap the first to third emission areas EA1, EA2, and EA3. The driving electrode TE may be formed of a single layer containing, for example, molybdenum (Mo), titanium (Ti), copper (Cu), or aluminum (Al), indium tin oxide (ITO) or may be formed to have, for example, a stacked structure (Ti/Al/Ti) of aluminum and titanium, a stacked structure (ITO/Al/ITO) of aluminum and indium tin oxide (ITO), an Ag—Pd—Cu (APC) alloy, or a stacked structure (ITO/APC/ITO) of APC alloy and ITO.

The second insulating layer SIL2 may be disposed on the first insulating layer SIL1 and the driving electrode TE. The second insulating layer SIL2 may have an insulating function and an optical function. The second insulating layer SIL2 may be made of the material exemplified in association with the first insulating layer SIL1.

The antireflection layer ARL may include a second light blocking part BK2, a color filter CF, a third insulating layer SIL3, a first light blocking part BK1 and a fourth insulating layer SIL4.

The second light blocking part BK2 may be disposed on the second insulating layer SIL2. The second light blocking part BK2 may overlap the driving electrode TE and may prevent or reduce light reflection by the driving electrode TE. The second light blocking part BK2 may contain a light absorbing material. For example, the second light blocking part BK2 may include an inorganic black pigment, an organic black pigment or an organic blue pigment. The inorganic black pigment may be metal oxide such as, for example, carbon black or titanium black, the organic black pigment may include at least one of, for example, lactam black, perylene black, or aniline black, and the organic blue pigment may be, for example, C.I. pigment blue, but embodiments are not limited thereto. The second light blocking part BK2 may prevent or reduce visible light infiltration and color mixture between the first to third emission areas EA1, EA2, and EA3, which may result in an improvement of color reproducibility of the display device 10.

The plurality of color filters CF may include first to third color filters CF1, CF2 and CF3. Each of the first to third color filters CF1, CF2 and CF3 may be respectively disposed corresponding to the first insulating layer SIL1 on the first insulating layer SIL1.

The first color filter CF1 may be disposed in the first emission area EA1 on the first insulating layer SIL1. The first color filter CF1 may be surrounded by the second light blocking part BK2 in a plan view. The edge of the first color filter CF1 may cover a part of the upper surface of the second light blocking part BK2, but is not limited thereto. The first color filter CF1 may selectively allow the first color light (e.g., red light) to pass therethrough, and block or absorb the second color light (e.g., green light) and the third color light (e.g., blue light). For example, the first color filter CF1 may be a red color filter and contain a red colorant.

The second color filter CF2 may be disposed in the second emission area EA2 on the first insulating layer SIL1. The second color filter CF2 may be surrounded by the second light blocking part BK2 in a plan view. The edge of the second color filter CF2 may cover a part of the upper surface of the second light blocking part BK2, an edge of the first color filter CF1 or an edge of the third color filter CF3. The second color filter CF2 may selectively allow the second color light (e.g., green light) to pass therethrough, and block or absorb the first color light (e.g., red light) and the third color light (e.g., blue light). For example, the second color filter CF2 may be a green color filter and contain a green colorant.

The third color filter CF3 may be disposed in the third emission area EA3 on the first insulating layer SIL1. The third color filter CF3 may be surrounded by the second light blocking part BK2 in a plan view. The edge of the third color filter CF3 may cover a part of the upper surface of the second light blocking part BK2, but is not limited thereto. The third color filter CF3 may selectively allow the third color light (e.g., blue light) to pass therethrough, and block or absorb the first color light (e.g., red light) and the second color light (e.g., green light). For example, the third color filter CF3 may be a blue color filter and contain a blue colorant.

The first to third color filters CF1, CF2, and CF3 may absorb a part of the light coming from the outside of the display device 10, which may reduce the reflected light of the external light. As a result, in an embodiment, the first to third color filters CF1, CF2, and CF3 can prevent or reduce color distortion caused by the reflection of the external light.

The third insulating layer SIL3 may cover the first to third color filters CF1, CF2 and CF3. The third insulating layer SIL3 may have an insulating function and an optical function. The third insulating layer SIL3 may be made of the material exemplified in association with the first insulating layer SIL1.

The first light blocking part BK1 may be disposed on the second insulating layer SIL2 in the light blocking region BA. The light blocking area BA may surround the first to third emission areas EA1, EA2, and EA3. The first light blocking part BK1 may overlap the second light blocking part BK2 and the driving electrode TE, which may prevent or reduce the light reflection by the driving electrode TE. The first light blocking part BK1 may contain a light absorbing material. For example, the first light blocking part BK1 may include an inorganic black pigment, an organic black pigment or an organic blue pigment. The inorganic black pigment may be, for example, metal oxide such as carbon black or titanium black, the organic black pigment may include at least one of, for example, lactam black, perylene black, or aniline black, and the organic blue pigment may be C.I. pigment blue, but embodiments are not limited thereto. The first light blocking part BK1 may prevent or reduce visible light infiltration and color mixture between the first to third emission areas EA1, EA2, and EA3, which may result in an improvement of color reproducibility of the display device 10.

By including an insertion portion IST that is inserted into the second insulating layer SIL2, a part of the first light blocking part BK1 may form a code pattern CP and the other part of the first light blocking part BK1 may form a non-code pattern NP that does not have the insertion portion IST. A first height H1 may correspond to a length from the second insulating layer SIL2 to the upper surface of the first light blocking part BK1, a second height H2 may correspond to a length from the second insulating layer SIL2 to the lower surface of the insertion portion IST, and a third height H3 may correspond to the length from the first insulating layer SIL1 to the upper surface of the second light blocking part BK2. The thickness of the code pattern CP may correspond to the sum of the first height H1 and the second height H2 and the thickness of the non-code pattern NP may correspond to the first height H1. For example, the first height H1 may be about 1 μm to about 1.5 μm, the second height H2 may be about 0.5 μm or more, and the third height H3 may be about 1.5 μm to about 2 μm. For another example, the first height H1 may be about 1.5 μm or more, the second height H2 may be about 0.5 μm or more, and the third height H3 may be about 2 μm or more. Accordingly, the thickness of the code pattern CP may be greater by about 0.5 μm than the thickness of the non-code pattern NP and a predetermined difference in infrared reflectance may be secured. The infrared transmittance of the code pattern CP may be about 30% or less and the infrared transmittance of the non-code pattern NP may be about 45% or more, but the present disclosure is not limited thereto.

The driving electrode TE may have an eighth width W8, and the second light blocking part BK2 may have a ninth width W9 greater than the eighth width W8. The eighth width W8 of the first light blocking part BK1 may be greater than the width of the driving electrode TE. The first and second light blocking parts BK1 and BK2 may overlap the driving electrode TE, which may prevent or reduce the light reflection by the driving electrode TE.

The light blocking part BK1 may have different infrared reflectance depending on the thickness. In an embodiment, the code pattern CP and the non-code pattern NP are not visually recognized since a difference in visible light reflectance is relatively small. Since the code pattern CP and the non-code pattern NP have a predetermined infrared reflectance difference, the code pattern CP can be distinguished from the non-code pattern NP in a case in which the infrared camera captures the light blocking part BK. Because the code pattern CP is photographed by the infrared camera, deterioration of the image quality of the display device 10 may be prevented or reduced according to embodiments.

The fourth insulating layer SIL4 may cover the first light blocking part BK1 and the third insulating layer SIL3. The fourth insulating layer SIL4 may have an insulating function and an optical function. The fourth insulating layer SIL4 may be made of the material exemplified in association with the first insulating layer SIL1.

A protection film PF may be disposed on the touch sensing unit TSU. The protection film PF may be attached on the touch sensing unit TSU by the adhesive member. The protection film PF may be disposed on the front surface of the display device 10 and may protect the display device 10.

Figure 15:
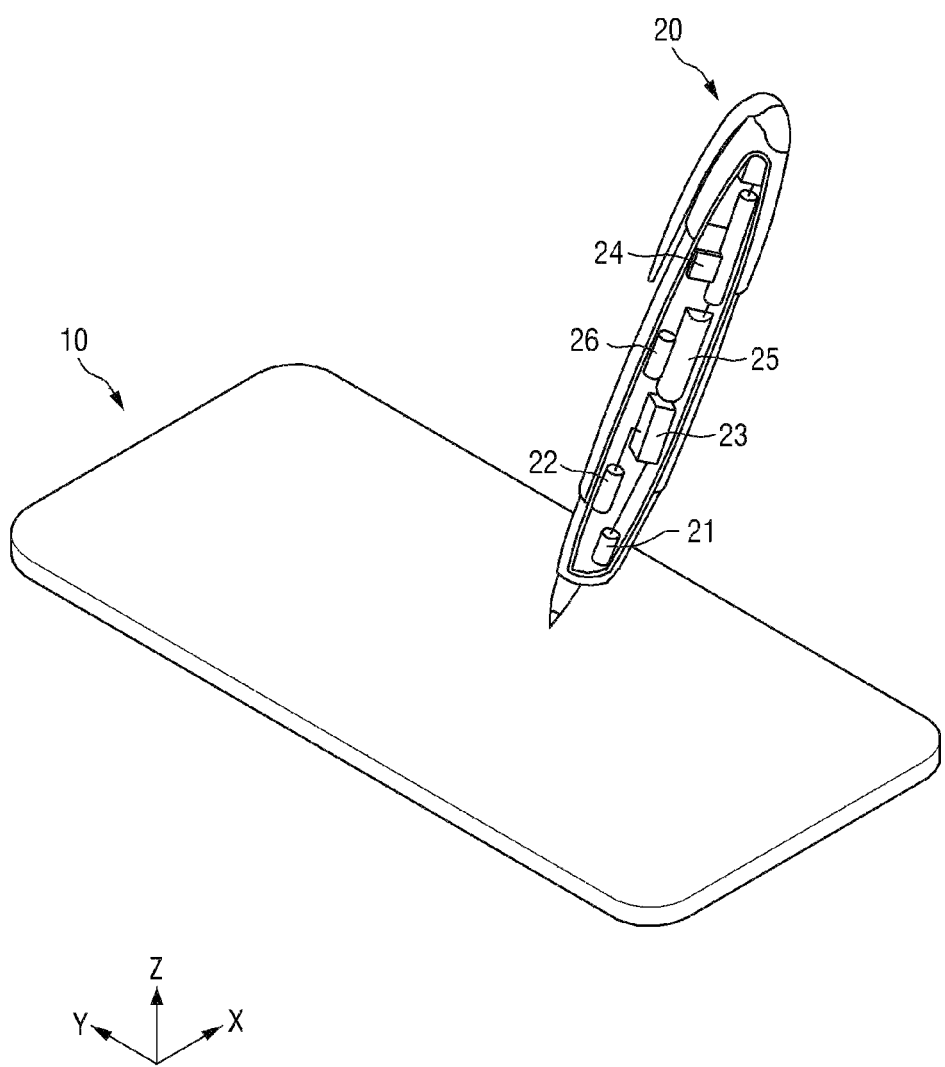
FIG. 15 is a perspective view illustrating an input system according to an embodiment.
Figure 16:
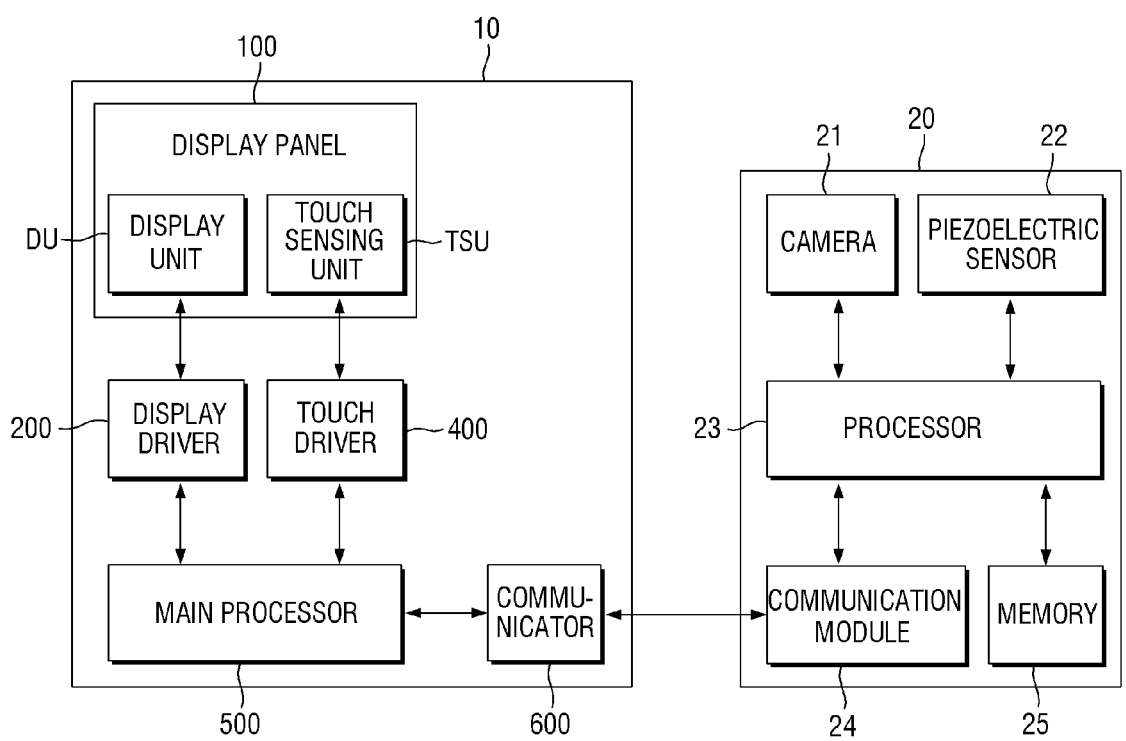
FIG. 16 is a block diagram illustrating a display device and an input device in an input system according to an embodiment.

FIG. 15 is a perspective view illustrating an input system according to an embodiment. FIG. 16 is a block diagram illustrating a display device and an input device in an input system according to an embodiment.

Referring to FIGS. 15 and 16, the input system may include a display device 10 and an input device 20.

The display device 10 may include a display panel 100, a display driver 200, a touch driver 400, a main processor 500 and a communication unit 600.

The display panel 100 may include the display unit DU and the touch sensing unit TSU. The display unit DU may include a plurality of pixels that display an image.

The touch sensing unit TSU may include the plurality of touch electrodes SEN that sense a user's touch in a capacitive manner. The display device 10 may detect a touch or approach of the input device 20 by including the code pattern CP. The code pattern CP may be determined by the planar shape of the light blocking part BK to have position information. At least one code pattern CP or a combination of the code patterns CP may correspond to a preset data code value.

The display driver 200 may output signals and voltages that drive the display unit DU. The display driver 200 may supply data voltages to data lines. The display driver 200 may supply a power voltage to the power line and may supply gate control signals to the gate driver.

The touch driver 400 may be electrically connected to the touch sensing unit TSU. The touch driver 400 may supply a touch driving signal to a plurality of touch electrodes SEN of the touch sensing unit TSU and may sense an amount of change in capacitance between the plurality of touch electrodes SEN. The touch driver 400 may calculate whether a user's input is made and calculate input coordinates based on an amount of change in capacitance between the plurality of touch electrodes SEN.

The main processor 500 may control all functions of the display device 10. For example, the main processor 500 may supply digital video data to the display driver 200 such that the display panel 100 displays an image. For example, the main processor 500 may receive touch data from the touch driver 400 and may use this data to determine a user's input coordinates, and then may generate digital video data according to the input coordinates, or execute an application indicated by an icon displayed at a location corresponding to the user's input coordinates. As another example, the main processor 500 may receive coordinate data from the input device 20 and may use this data to determine input coordinates of the input device and then may generate digital video data according to the input coordinates or execute an application indicated by an icon displayed at a location corresponding to the input coordinates of the input device 20.

The communication unit 600 may perform wired/wireless communication with an external device. For example, the communication unit 600 may transmit/receive a communication signal to/from a communication module 24 of the input device 20. The communication unit 600 may receive coordinate data composed of data codes from the input device 20, and may provide the coordinate data to the main processor 500.

The input device 20 may include the camera 21, a piezoelectric sensor 22, a processor 23, the communication module 24, and a memory 25. In an embodiment, the input device 20 may further include a battery. For example, the input device 20 may be an input pen that generates coordinate data using an optical method. The input pen may be, for example, a smart pen, an electromagnetic pen, or an active pen, but is not limited thereto.

The camera 21 may be disposed near the front of the input device 20. The camera 21 may photograph the code pattern CP determined by the planar shape of the second light blocking part BK2. Along the movement of the input device 20, the camera 21 may continuously photograph the code pattern CP of the corresponding position. The camera 21 may provide the captured image to the processor 23. For example, the camera 21 may photograph the code pattern CP using infrared light, but is not limited thereto.

The piezoelectric sensor 22 may sense a pressure applied to the display device 10 by the input device 20. The piezoelectric sensor 22 may provide pressure information of the input device 20 to the processor 23.

The processor 23 may receive an image of the code pattern CP from the camera 21. The processor 23 may convert the code pattern CP into a corresponding data code, and may generate coordinate data by combining the data codes. The processor 23 may transmit the generated coordinate data to the display device 10 through the communication module 24.

The processor 23 may receive the image of the code pattern CP and convert at least one code pattern CP or a combination of the code patterns CP into a data code corresponding in a one-to-one correspondence. As a result, the coordinate data may be rapidly generated without complex calculation and correction according to embodiments. Accordingly, the input system may perform a corresponding function based on accurate input coordinates, may reduce cost and power consumption, and may simplify a driving process according to embodiments of the present disclosure. In addition, as the input system includes the plurality of code patterns CP provided on the touch sensing unit TSU, the input system is not limited in size, and may be applied to all electronic devices having a touch function, according to embodiments of the present disclosure.

The communication module 24 may perform wired/wireless communication with an external device. For example, the communication module 24 may transmit/receive a communication signal to/from the communication unit 600 of the display device 10. The communication module 24 may receive coordinate data composed of data codes from the processor 23, and may provide the coordinate data to the communication unit 600.

The memory 25 may store data used to drive the input device 20. Since the input device 20 may convert at least one code pattern CP or a combination of the code patterns CP into a data code corresponding in a one-to-one correspondence and may directly provide coordinate data to the display device 10, the memory 25 included in the input device 20 may have a relatively small capacity. While the present disclosure has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display device, comprising:
    a plurality of emission areas that emit light;
    a plurality of touch electrodes disposed in a light blocking area surrounding the plurality of emission areas, wherein the touch electrodes sense a touch;
    a first insulating layer disposed on the plurality of touch electrodes; and
    a plurality of light blocking parts disposed on the first insulating layer and overlapping the plurality of touch electrodes,
    wherein a part of the plurality of light blocking parts includes a code pattern formed by an insertion portion inserted into the first insulating layer and overlapping the plurality of touch electrodes, and another part of the plurality of light blocking parts includes a non-code pattern formed by not having the insertion portion.

2. The display device of claim 1, wherein the code pattern and the non-code pattern have a difference in reflectance with respect to light of a specific wavelength.

3. The display device of claim 1, wherein a thickness of the code pattern is greater by about 0.5 μm than a thickness of the non-code pattern.

4. The display device of claim 1, wherein a width of each of the touch electrodes is smaller than a width of each of the light blocking parts.

5. The display device of claim 1, further comprising:
    a second insulating layer disposed between the plurality of touch electrodes and the first insulating layer,
    wherein the insertion portion is inserted into the first insulating layer and is in contact with an upper surface of the second insulating layer.

6. The display device of claim 5, further comprising:
    a bridge electrode disposed on the second insulating layer and electrically connected to a part of the touch electrodes among the plurality of touch electrodes.

7. The display device of claim 1, further comprising:
    a bridge electrode disposed on a bottom of the plurality of touch electrodes and electrically connected to a part of the touch electrodes among the plurality of touch electrodes.

8. The display device of claim 7, wherein the insertion portion is in contact with an upper surface of an overlapping touch electrode among the plurality of touch electrodes.

9. The display device of claim 1, further comprising:
    a bridge electrode disposed on the first insulating layer, covered by a part of the plurality of light blocking parts, and electrically connected to a part of the touch electrodes among the plurality of touch electrodes.

10. The display device of claim 9, wherein the insertion portion is in contact with an upper surface of an overlapping touch electrode among the plurality of touch electrodes.

11. The display device of claim 1, wherein the plurality of light blocking parts comprise a first portion extending in a first direction and a second portion crossing the first portion,
    wherein in a case in which an intersection point of the first portion and the second portion overlaps the code pattern, a width of the corresponding light blocking part is relatively increased compared to a case in which the intersection point does not overlap the code pattern.

12. The display device of claim 1, wherein the code pattern is formed in a planar mesh structure and surrounds at least one of the plurality of emission areas.

13. A display device, comprising:
    a plurality of emission areas that emit light;
    a first insulating layer;

a plurality of touch electrodes disposed on the first insulating layer in a light blocking area surrounding the plurality of emission areas, wherein the touch electrodes sense a touch;

a plurality of first light blocking parts covering the plurality of touch electrodes;

a plurality of color filters respectively disposed on the first insulating layer in areas corresponding to the plurality of emission areas;

a second insulating layer disposed on the plurality of color filters; and a plurality of second light blocking parts disposed on the second insulating layer and overlapping the plurality of touch electrodes, wherein a part of the plurality of second light blocking parts includes a code pattern formed by an insertion portion inserted into the second insulating layer and overlapping the plurality of touch electrodes, and another part of the plurality of second light blocking parts includes a non-code pattern formed by not having the insertion portion.

14. The display device of claim 13, wherein the code pattern and the non-code pattern have a difference in reflectance with respect to light of a specific wavelength.

15. The display device of claim 13, wherein a thickness of the code pattern is greater by about 0.5 μm than a thickness of the non-code pattern.

16. The display device of claim 13, wherein the insertion portion is in contact with an upper surface of the plurality of the color filters.

17. The display device of claim 13, wherein the plurality of emission areas comprise a first emission area, a second emission area having a smaller size than the first emission area, and a third emission area having a larger size than the first emission area, the plurality of color filters comprise a first color filter disposed in the first emission area, a second color filter disposed in the second emission area, and a third color filter disposed in the third emission area, and an edge of the second color filter covers an edge of the third color filter or the first color filter.

18. The display device of claim 13, wherein a width of the first light blocking part is greater than a width of a corresponding touch electrode among the plurality of touch electrodes, and a width of the second light blocking part is greater than the width of the first light blocking part.

19. The display device of claim 13, further comprising:

a bridge electrode disposed on a bottom of the plurality of touch electrodes and electrically connected to a part of the touch electrodes among the plurality of touch electrodes.

20. An input system, comprising:

a display device configured to display an image; and an input device configured to input a touch to the display device, wherein the display device comprises:

a plurality of emission areas that emit light;

a plurality of touch electrodes disposed in a light blocking area surrounding the plurality of emission areas, wherein the touch electrodes sense a touch;

a first insulating layer disposed on the plurality of touch electrodes; and a plurality of light blocking parts disposed on the first insulating layer and overlapping the plurality of touch electrodes, wherein a part of the plurality of light blocking parts includes a code pattern formed by an insertion portion inserted into the first insulating layer and overlapping the plurality of touch electrodes, and another part of the plurality of light blocking parts includes a non-code pattern formed by not having the insertion portion, and the input device photographs the code pattern, converts the code pattern into a preset data code, and transmits coordinate data composed of the data code to the display device.

* * * * *